United States Patent
Tsern

(10) Patent No.: US 7,734,866 B2
(45) Date of Patent: Jun. 8, 2010

(54) MEMORY WITH ADDRESS-DIFFERENTIATED REFRESH RATE TO ACCOMMODATE LOW-RETENTION STORAGE ROWS

(75) Inventor: Ely K. Tsern, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 95 days.

(21) Appl. No.: 11/198,708

(22) Filed: Aug. 4, 2005

(65) Prior Publication Data

US 2007/0033338 A1 Feb. 8, 2007

(51) Int. Cl.
- G06F 12/00 (2006.01)
- G06F 13/00 (2006.01)
- G06F 13/28 (2006.01)
- G11C 7/00 (2006.01)
- G11C 16/06 (2006.01)

(52) U.S. Cl. .................. 711/106; 711/108; 711/113; 711/114; 711/118; 365/185.25; 365/222

(58) Field of Classification Search ............... 711/100, 711/104, 105, 106, 108, 113–114, 118; 365/185.25, 365/222

See application file for complete search history.

(56) References Cited

U.S. PATENT DOCUMENTS

| | | | |
|---|---|---|---|
| 5,329,490 A | 7/1994 | Murotani | |
| 5,629,898 A | 5/1997 | Idei et al. | |
| 5,712,825 A | 1/1998 | Hadderman | |
| 5,991,218 A | 11/1999 | Kushiyama | |
| 6,201,733 B1 | 3/2001 | Hiraki et al. | |
| 6,272,588 B1 | 8/2001 | Johnston | |
| 6,341,090 B1 | 1/2002 | Hiraki et al. | |
| 6,449,197 B1 | 9/2002 | Hiraki et al. | |
| 6,542,414 B2 | 4/2003 | Hiraki et al. | |
| 6,781,893 B2 | 8/2004 | Hiraki et al. | |
| 6,781,908 B1 | 8/2004 | Pelley | |
| 6,862,240 B2 * | 3/2005 | Burgan | 365/222 |
| 6,873,555 B2 | 3/2005 | Hiraki et al. | |
| 6,920,523 B2 | 7/2005 | Le | |
| 6,940,773 B2 | 9/2005 | Poechmueller | |
| 6,961,281 B2 | 11/2005 | Wong | |
| 7,028,136 B1 | 4/2006 | Priyadarshan | |
| 7,095,669 B2 | 8/2006 | Oh | |
| 7,116,602 B2 * | 10/2006 | Klein | 365/222 |
| 2003/0081488 A1 | 5/2003 | Fibranz | |
| 2003/0147295 A1 * | 8/2003 | Frankowsky et al. | 365/222 |
| 2003/0161208 A1 | 8/2003 | Nakashima | |
| 2003/0169634 A1 * | 9/2003 | Kilmer et al. | 365/222 |

(Continued)

OTHER PUBLICATIONS

International Search Report and Written Opinion of the International Searching Authority in International Application PCT/US2006/030413, World Intellectual Property Organization, Dec. 14, 2006, 8 pages.

(Continued)

*Primary Examiner*—Sanjiv Shah
*Assistant Examiner*—Yaima Campos
(74) *Attorney, Agent, or Firm*—Mahamedi Paradice Kreisman LLP

(57) ABSTRACT

In a dynamic random access memory device, receiving refresh commands via a signaling interface and, in response to the refresh commands, refreshing a first row of storage cells at a first refresh rate and refreshing a second row of storage cells at a second, faster refresh rate.

23 Claims, 14 Drawing Sheets

U.S. PATENT DOCUMENTS

| | | | |
|---|---|---|---|
| 2005/0060488 A1* | 3/2005 | Poechmueller | 711/106 |
| 2005/0099868 A1 | 5/2005 | Oh | |
| 2006/0018174 A1* | 1/2006 | Park et al. | 365/222 |
| 2006/0028893 A1 | 2/2006 | Nakashima | |

OTHER PUBLICATIONS

Obsawa, T. et al., "Optimizing the DRAM Refresh Count for Merged DRAM/Logic LSIs", Pattern Recoginition, ISLPED 98, Monterey, CA, Aug. 10-12, 1998, pp. 82-87.

S. Takase and n. Kushiyama, "A 1.6-GByte/s DRAM with Flexible Mapping Redundancy Technique and Additional Refresh Scheme," IEEE Journal of Solid-State Circuits, vol. 34, No. 11, Nov. 1999, pp. 1600-1606.

Idei, Youji, et al., "Dual-Period Self-Refresh Scheme for Low Power DRAMs with On-Chip PROM Mode Register", IEEE 1998, Journal of Solid-State Circuits, pp. 253-259.

Kim, Joohee, "Block-Based Multiperiod Dynamic Memory Design for Low Data-Retention Power", IEEE 2003, Transactions on VLSI Systems, pp. 1006-1018.

* cited by examiner

MEMORY WITH ADDRESS-DIFFERENTIATED REFRESH RATE TO ACCOMMODATE LOW-RETENTION STORAGE ROWS

TECHNICAL FIELD

The disclosure herein relates to the field of data storage.

BACKGROUND

Cell retention time is a key limiter of production yield in dynamic random access memories (DRAMs), as devices that fail to retain data over a specified refresh interval, tREF, are typically discarded. Unfortunately, cell retention times continue to drop as process geometries shrink, pressuring manufacturers to increase the refresh rate in new generations of DRAMs (thus increasing refresh overhead and compromising performance) or suffer reduced yield due to cell retention failure.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
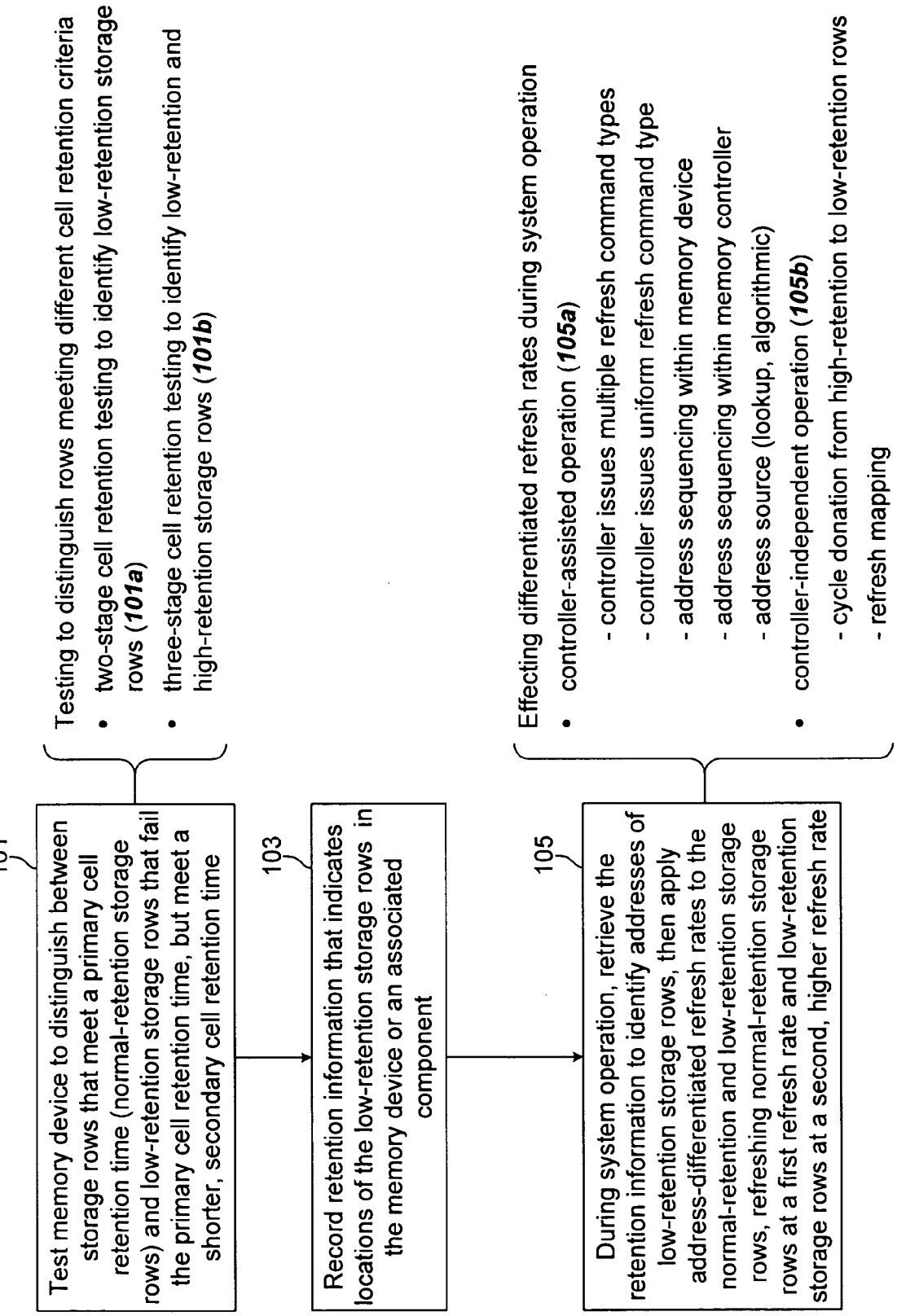
FIG. 1 illustrates an embodiment of a method of achieving address-differentiated refresh rates.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. Also signals referred to herein as clock signals may alternatively be strobe signals or other signals that provide event timing.

With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{signalname}}$') is also used to indicate an active low signal. The term "coupled" is used herein to express a direct connection as well as connections through one or more intermediary circuits or structures. The term "exemplary" is used herein to express an example, not a preference or requirement.

With regard to terminology particular to data storage systems, the expression "dynamic random access memory" (DRAM) is used herein to mean any type of volatile random access memory that requires periodic refresh to avoid data loss and should not be construed as limited to a specific type of storage technology. Also, the expression "memory device" is generally used herein to refer to an integrated circuit die (or package containing same) having predominantly a data storage function, though a memory device may include additional circuitry on the same die or within the same package, for example, to perform a memory controller function or other control function. The term "memory" alone refers broadly to a memory system or memory device.

I. Overview

Memory devices that support address-differentiated refresh rates are disclosed in various embodiments, along with counterpart memory controllers. In a general embodiment, shown in FIG. 1, a memory device is tested at 101 to distinguish between normal-retention storage rows that reliably retain data over a primary cell retention time (e.g., tREF) and storage rows, referred to herein as low-retention rows, that fail to meet the primary cell retention time, but reliably retain data over a shorter, secondary cell retention time. Retention information that indicates locations of the low-retention storage rows (i.e., addresses or information that may be used to derive addresses) is recorded in the memory device or an associated component at 103. Thereafter, during memory device operation, the retention information is used to differentiate the frequency of refresh operations directed to normal-retention and low-retention storage rows. For example, as shown at 105, normal-retention storage rows are refreshed at a first refresh rate that corresponds to the primary cell retention time and low-retention rows are refreshed at a second, faster refresh rate that corresponds to the secondary cell retention time. By providing differentiated refresh rates in this manner, memory devices that may otherwise be discarded for failing cell retention testing may be salvaged without having to increase the refresh rate applied to all the storage rows of the memory device. Thus, production yield may be increased (or at least maintained) without significantly increasing refresh overhead.

Still referring to FIG. 1, a number of testing techniques may be employed to distinguish between storage rows meeting different cell retention criteria. For example, in one embodiment (101a), a two-stage cell retention test is performed to identify low-retention rows, and in another embodiment (101b), a three-stage cell retention test is performed to additionally identify high-retention storage rows; storage rows that reliably retain data over an extended time interval. As discussed below, refresh operations otherwise directed to a high-retention row during a given refresh interval may be re-directed or donated to a low-retention row, thus increasing the refresh rate for the low-retention row without having to increase the total number of refresh operations performed per refresh cycle.

With regard to system operation, in one class of embodiments referenced generally at 105a, the memory controller assists in effecting differentiated refresh rates, for example, by issuing differentiated refresh command types to refresh normal-retention and low-retention storage rows or by issuing uniform type of refresh command at a rate sufficient to enable each normal-retention row to be refreshed once per refresh cycle and to enable each low-retention row to be refreshed more than once per refresh cycle. In controller-assisted embodiments (105a), the sequencing of addresses directed to normal-retention and low-retention rows may be effected within the memory device, the memory controller, or both (e.g., one component of a refresh address may be sequenced by the memory controller and another component sequenced by the memory device). Also, address sequencing may be mode-dependent, being performed, at least in part, in the memory controller in one operating mode and in the memory device in another operating mode. Further, low-retention row addresses may be sourced by a lookup table or similar structure, or may be algorithmically generated, for example, where the low-retention row addresses fall within one of a number of selectable address patterns.

In another class of embodiments referenced generally at 105b, the memory device effects differentiated refresh rates without controller assistance, thus enabling the memory device to be used with a conventional memory controller. In one controller-independent embodiment, refresh operations are re-directed from high-retention rows to low-retention rows to increase the refresh rate of the low-retention rows without increasing the net number of refresh operations performed within a given refresh interval. In a particular embodiment, such cycle donation operation is effected by manipulating an otherwise ordered sequence of row addresses to include two instances of each low-retention row address (spaced apart to achieve a substantially periodic refresh rate that is twice the refresh rate applied to normal-retention rows) per refresh cycle, a single instance of each normal-retention row address per refresh cycle and, for each low-retention address, an instance of a first associated high-retention row address in every even-numbered refresh cycle and an instance of a second associated high-retention row address in every odd-numbered refresh cycle. By associating a pair of high-retention rows with each low-retention row in this manner, each of the high-retention rows, in effect, donate a refresh time slot (i.e., refresh window) to the low retention row in alternating odd- and even-numbered refresh intervals, thereby refreshing the low-retention row at twice the rate of normal-retention rows and refreshing each of the high-retention rows at half the rate of the normal-retention rows. The operations used to generate the desired sequence of row addresses are referred to herein as refresh address mapping and may be implemented by a number of refresh mapping embodiments described below.

II. Effecting Increased Refresh Rate in Low-Retention Rows

A. Controller-Assisted Operation

1. Differentiated Refresh Command Types

Figure 2:
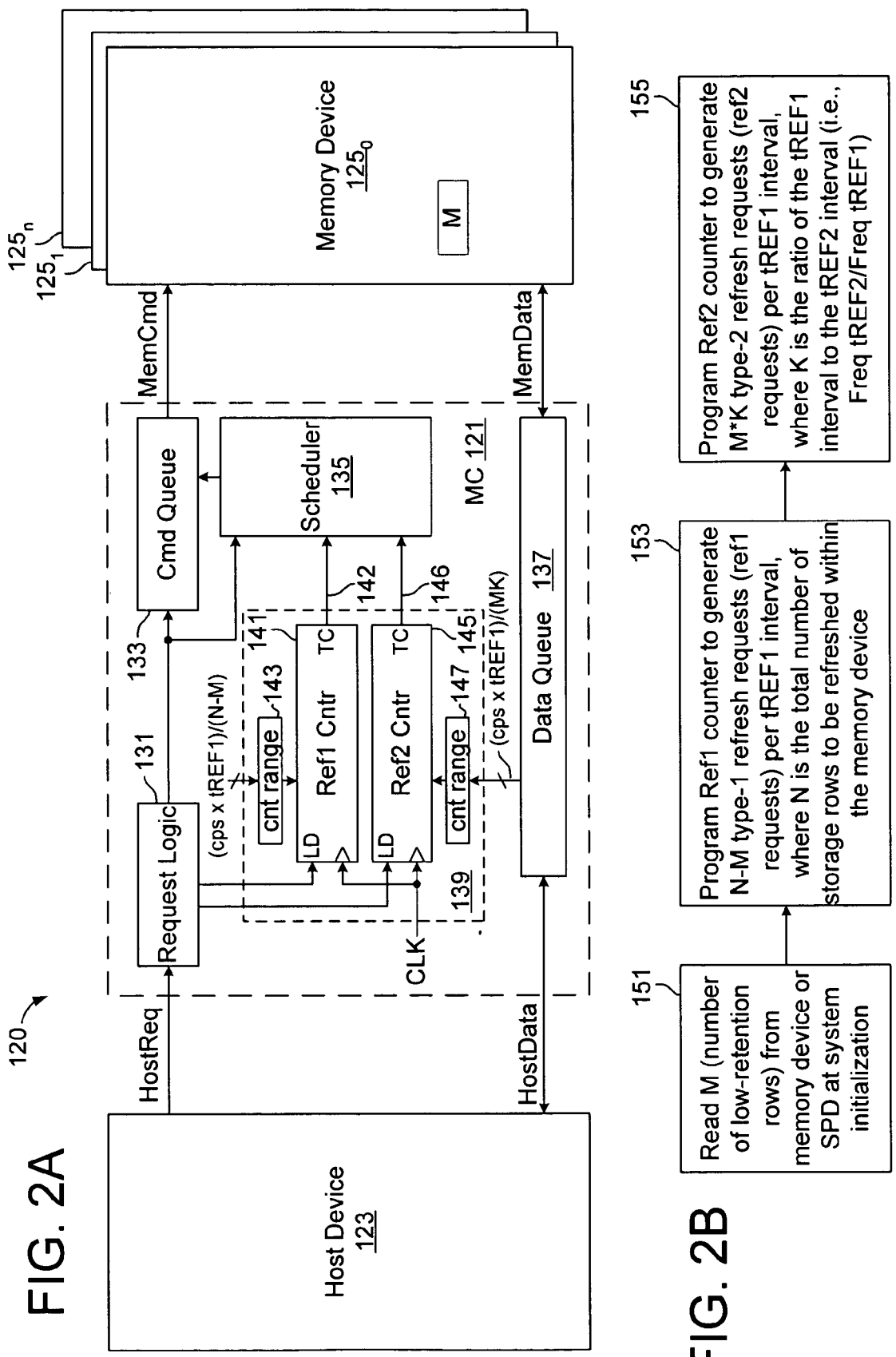
FIG. 2A illustrates an embodiment of a memory system that supports address-differentiated refreshing in a memory device having low-retention storage rows.
FIG. 2B illustrates an approach to programming desired refresh rates within the memory controller of FIG. 2A according to one embodiment.

FIG. 2A illustrates an embodiment of a memory system 120 that supports address-differentiated refreshing in a memory device having low-retention storage rows. The memory system 120 includes a memory controller 121 (MC) coupled to a host device 123 (e.g., a programmed processor, direct memory access (DMA) controller, or other access requestor) via host request and data paths (HostReq, HostData), and to one or more memory devices $125_0$-$125_n$ via memory command and data paths (MemCmd, MemData). At both the host interface and memory interface, addressing information may be multiplexed onto either or both of the signaling paths shown and/or separate addressing paths may be provided. More generally, all signals transferred between the memory controller 121 and host device 123 and between the memory controller 121 and memory devices $125_0$-$125_n$ may share a given signaling path with one or more other signals or may be allocated a dedicated signaling path. With regard to the memory interface, the command path and/or data path may be implemented by one or more multi-drop buses or by point-to-point signaling links. In one embodiment, for example, the data path is implemented by sets of point-to-point links between the memory controller and respective memory devices, while the command path is coupled to multiple memory devices in parallel, thus forming a multi-drop bus. Clock signals, strobe signals or timing control information may be carried on dedicated signal lines within the host request path and memory command path, or may be embedded in data and command transmissions with appropriate clock-data recovery circuitry provided in the recipient device to recover the timing information.

The memory devices $125_0$-$125_n$ may be disposed on one or more registered or unregistered memory modules, with such modules optionally including a serial presence detect component or other non-volatile storage (not shown) for storing information for characterizing the memory devices and/or module. Alternatively, the memory devices $125_0$-$125_n$ may be packaged together with the memory controller 121 and/or host device 123, for example, in a system-in-package DRAM (SIPDRAM), system on chip (SOC) or other multi-chip package. In yet other embodiments, the memory devices or any subset thereof may be formed on the same die as the memory controller 121 and/or host device 123 with the signaling paths therebetween effected by chip-level interconnects (e.g., traces formed in metal layers disposed over a semiconductor substrate). Similarly, the memory controller may be formed on the same die as the host device.

Internally, the memory controller 121 includes a request logic circuit 131 to receive and process requests from the host device 123 which may include, for example, memory access requests (e.g., read and write requests); requests to retrieve status or configuration information from the memory devices $125_0$-$125_n$, associated non-volatile storage or memory controller 121; and requests to store configuration information in the memory controller 121 and/or memory devices 125. Memory access requests and other host requests directed to memory devices $125_0$-$125_n$ are organized into a sequence of memory commands and forwarded to a command queue 133 for eventual output via the memory command path. Write data and configuration information associated with write access requests and memory configuration requests are similarly queued in a data queue 137 for eventual output to the memory devices $125_0$-$125_n$ in a predetermined timing relationship with the counterpart access and configuration commands. Read data and status information received from the memory devices $125_0$-$125_n$ or from a source within the memory controller 121 itself are similarly queued within the data queue 137 to be returned to the host device 123.

The memory controller 121 additionally includes scheduling logic 135 ("a scheduler") to arbitrate between the request logic 131 and other command sources, allocating storage within the command queue 133 for host-initiated commands (i.e., from the request logic 131) and self-initiated commands, including refresh commands and other device control commands (e.g., signaling calibration commands, power-mode commands, etc.) according to a predetermined arbitration policy. In one embodiment, for example, the scheduler 135 responds to refresh request signals generated by refresh logic 139 by inserting corresponding refresh commands into the command queue, thus scheduling refresh commands to be sent to one or more of the memory devices $125_0$-$125_n$.

In one embodiment, the refresh logic 139 issues two different types of refresh request signals that correspond to differentiated refresh rates to be applied within one or more of the memory devices $125_0$-$125_n$. More specifically, a primary refresh request signal 142 corresponds to the primary refresh rate for normal-retention storage rows within the memory devices, while a secondary refresh request signal 146 corresponds to an accelerated, secondary refresh rate to be applied to low-retention storage rows. Because normal-retention storage rows are to be refreshed once per tREF interval (the primary refresh interval), the primary refresh rate may be expressed as 1/tREF, and the primary refresh request signal 142 asserted, for a given memory device 125, at least N–M times per tREF interval, where N is the total number of storage rows to be refreshed within the memory device and M is the number of low-retention rows within the memory device. Similarly, because each low-retention row is to be refreshed once per each abbreviated refresh interval, tREFa (the secondary refresh interval), the secondary refresh rate may be expressed as 1/tREFa, and the secondary refresh request signal 146 asserted, for a given memory device, M times per tREFa interval. Letting K represent the ratio between the primary and secondary refresh intervals (i.e., K=tREF/tREFa), the assertion frequency of the secondary refresh request signal 146 may be expressed as MK/tREF.

In one embodiment, the refresh logic 139 includes primary and secondary refresh counters 141 and 145 to assert the primary and secondary refresh request signals at desired rates. More specifically, assuming that both of the counters 141, 145 are clocked by a clock signal (CLK) that yields a desired count rate, cps (counts per second), and that each counter asserts a respective refresh request signal (142, 146) upon counting up or down to a terminal count value, then the primary refresh counter 141 may be programmed to have count range (cps×tREF)/(N–M) to achieve the desired primary refresh request frequency for a given memory device 125, and the secondary refresh counter 145 may be programmed to have count range (cps×tREF)/(MK) to achieve the desired secondary refresh request frequency. For example, assuming a 100 MHz count rate (i.e., CLK frequency is 100 MHz), and a 32 millisecond tREF interval within a 1024-row memory device 125 determined to have eight low-retention rows (i.e., N=1024, M=8), then the primary refresh counter 141 may be programmed to have a count range of $(10^8 \times 32 \times 10^{-3})/(1024-8)=\sim3149$ in order to assert the primary refresh request signal N–M (1016) times per tREF interval to refresh each of the 1016 normal-retention rows within the memory device 125. Continuing with the example, if a 16 millisecond tREFa interval is assumed (i.e., K=2), then the secondary refresh counter 145 may be programmed to have a count range of $(10^8 \times 32 \times 10^{-3})/(8 \times 2)=200,000$ in order to assert the secondary refresh request signal MK (sixteen) times per tREF interval and thus refresh each of the eight low-retention rows twice. Note that count rates, tREF and tREFa values and numbers of storage rows are specified above, and similar parameters and others specified below, for purposes of example only. Any or all such specified parameters may be changed in various embodiments.

Still referring to FIG. 2A, to effect the desired count range within the primary and secondary refresh counters 141 and 145, the counters may be designed to repeatedly count down from a programmed initial count (e.g., following the example above, (3149–1) for the primary refresh counter 141, (200,000–1) for the secondary refresh counter 145) to a terminal count of zero, or to repeatedly count up from zero to a programmed terminal count, in each case asserting the terminal count signal (TC), and therefore a refresh request signal (142, 146), each time the terminal count is reached. More generally, any programming arrangement that achieves the desired number of count cycles between assertions of the terminal count signals may be used. Also, in an embodiment in which the number of clock cycles per secondary refresh request is certain to be greater than the number of clock cycles per primary refresh request (e.g., where M is limited to a threshold percentage of N), the secondary refresh counter 145 may be clocked by a lower frequency clock source (e.g., an intermediate bit of the count value within the primary refresh counter 141) than the primary refresh counter 141 to reduce the number of count bits to be maintained within the secondary refresh counter and thus save power and die area.

The number of low-retention storage rows (M) within a given memory device 125 may be retrieved from the memory device itself (e.g., by reading a status value or configuration register) or from a component associated with the memory device such as a serial presence detect (SPD) or other non-volatile storage including, without limitation, a programmed storage circuit (not shown) within memory controller 121 itself. In one embodiment, each of the memory devices 125$_0$-125$_n$ may have a different value of M so that no single primary or secondary refresh request rate is ideally suited to each. In such an embodiment, the memory controller 121 may include a separate instance of the refresh logic 139 for each of the memory devices 125$_0$-125$_n$, or groups of the memory devices. Alternatively, a maximum value of M may be determined from among the various memory devices 125$_0$-125$_n$ (or from an associated storage) and used to program the refresh logic 139. Further, as discussed below in reference to refresh address sequencing, the value of M may be fixed for a given device type so that, if memory devices 125$_0$-125$_n$ have a uniform device type, a single value of M may be retrieved and used to program the refresh logic 139.

In one embodiment, or at least in one operating mode, refresh commands are broadcast to all the memory devices 125$_0$-125$_n$ so that the total number of memory devices 'n', need not be taken into account when programming the refresh logic 139. Alternatively, where refresh commands are issued to specific memory devices (e.g., in round-robin fashion) and a single instance of the refresh logic 139 is used to generate refresh requests for each of the n memory devices 125$_0$-125$_n$, the programmed count ranges may be divided by 'n' to effect the desired refresh command rate. Similarly, in embodiments in which memory devices are grouped according to their connections to respective command paths (e.g., all memory devices coupled to a given path constituting a device rank), program values may be divided by the number of ranks, with refresh commands sent to different ranks in response to respective assertions of the refresh request signals (142, 146) but broadcast to devices in the same rank, or vice-versa (i.e., simultaneous broadcast to different ranks, but directed to a particular device within each rank).

Additionally, the storage arrays within the memory devices 125$_0$-125$_n$, or any one of them may be organized in separately addressable storage banks, with each of B banks containing a respective set of X rows. In one such embodiment, the scheduler 135 treats each storage row within each bank as a separate storage row for refresh purposes so that the primary and secondary refresh counters may be programmed as described above with N equal to BX (i.e., B times X). In another bank-organized embodiment, the scheduler schedules a burst of B primary refresh commands to a given memory device 125 (i.e., each refresh command directed to respective one of the B banks) in response to each assertion of primary refresh request signal 142 and likewise schedules a burst of B secondary refresh commands to the memory device 125 in response to each assertion of secondary refresh request signal 146. In such an embodiment, each storage row may be viewed, from the perspective of the refresh logic 139, as a composite row that spans all banks of the memory device 125 so that the primary and secondary refresh counters may be programmed as described above with N equal to X. In another bank-organized embodiment, the memory controller 121 may issue a burst of B primary refresh commands per assertion of the primary refresh request signal 142, but only one secondary refresh command per assertion of secondary refresh request signal 146, the secondary refresh command ultimately being applied to a low-retention row at a specific row and bank. In such an embodiment, the memory controller 121 may issue a burst of primary refresh commands to all storage rows within the memory device 125 (in which case the primary refresh counter may be programmed with cps×tREF/N) to ensure that all normal-retention rows that share the row address of the low-retention row are refreshed. Note that this operation will result in a slightly higher refresh overhead as BX+2M refresh commands will be issued (i.e., assuming K=1) instead of BX+M. Alternatively, if the memory controller 121 is aware of the bank and row address of low-retention rows and tracks the bank and row address to which primary refresh commands are issued, the scheduler 135 may refrain from issuing primary refresh commands to low-retention rows. In the latter case, the number of primary refresh commands issued in response to assertion of the primary refresh request signal may range from zero to B depending upon the number of low retention rows that share the target row address.

Reflecting on the operation of the memory system of FIG. 2A, it can be seen that the total number of refresh commands issued per refresh interval (tREF) is N−M+MK. In one embodiment, the number of low-retention storage rows, M, is limited at device production time to a threshold percentage (T) of the total number of storage rows, N (e.g., T=4% so that M≦0.04N, though any other practicable threshold may be applied), so that the increased number of refresh operations required to compensate for the low-retention rows, expressed as a percentage of N, is T(K−1). As K is generally a small number (e.g., K=2 to achieve a 2× refresh rate for low-retention rows, though smaller or larger values of K may be used), it follows that a relatively small increase in refresh overhead may be incurred to salvage memory devices otherwise discarded for failing to meet the primary cell retention time.

FIG. 2B illustrates an approach to programming desired refresh rates within the memory controller 121 of FIG. 2A according to one embodiment. Initially, at block 151, the memory controller determines the number of low-retention rows (M) within each of the memory devices 125$_0$-125$_n$, for example, by reading each of the memory devices in response to one or more host requests or by reading one or more serial presence detect devices (SPDs) or other non-volatile storage elements associated with the memory devices. In an embodiment in which separate refresh logic circuits 139 are provided for each memory device (or group of memory devices), the primary refresh counter 141 within each refresh logic circuit 139 may be programmed to generate N−M primary refresh requests per tREF interval as shown at 153, and the secondary refresh counter 145 programmed to generate MK secondary refresh requests per tREF interval as shown at 155, where the value of M is particular to the corresponding memory device or group of memory devices. In an embodiment where the memory controller includes only a single instance of the refresh logic, the values of M retrieved for respective memory devices may be compared to identify the largest value of M, $M_{MAX}$, and the primary and secondary refresh counters 141, 145 programmed to generate $N-M_{MAX}$ and $KM_{MAX}$ (K times $M_{MAX}$) refresh requests, respectively, during each tREF interval. In other embodiments, for example where memory devices are disposed on a memory module along with a serial presence detect or like storage, $M_{MAX}$ may be determined at module production time and recorded in the serial presence detect.

In one embodiment, the host device 123 issues configuration-read requests to the memory controller 121 to retrieve, from the memory controller 121, memory devices $125_0$-$125_n$ and/or other storage (e.g., serial presence detect), the parameters used to calculate the count ranges programmed within the refresh logic 139 (e.g., values of N, M, K, count rate, B and X, or any subset thereof). In other embodiments, one or more of the parameters may be assumed in the host device (e.g., recorded in a basic input-output service (BIOS) storage). In either case, the parameters may be processed within the host device 123, under program control for example, to generate the count range values to be programmed within the refresh logic 139, with the count range values supplied to the memory controller 121 in association with a configuration request. The memory controller 121 responds to the configuration request by recording the count range values (e.g., received via the host data path and queued in the data queue 137 or other buffer) in programmable storage elements 143, 147 associated with the refresh counters 141, 145 to establish the desired primary and secondary refresh rates. The count range values stored within the programmable storage elements 143, 147 may be, for example, start count values that are decremented to reach a zero-valued terminal count or terminal count values that are reached by incrementing an initially zero-valued count value.

As discussed above, in one embodiment, the refresh logic 139 may be replicated per memory device or per group of memory devices so that multiple programming operations may be carried out to establish count ranges within respective instances of the refresh logic 139 according to the specific parameters of the corresponding memory device or group of memory devices. Also, rather than reducing the count range of the primary refresh counter 141 to account for the additional refresh requests signaled by the secondary refresh counter 145, the primary refresh counter may be programmed with count values according to the total number of storage rows.

2. Address Sequencing in Response to Differentiated Refresh Command Types

Figure 3:
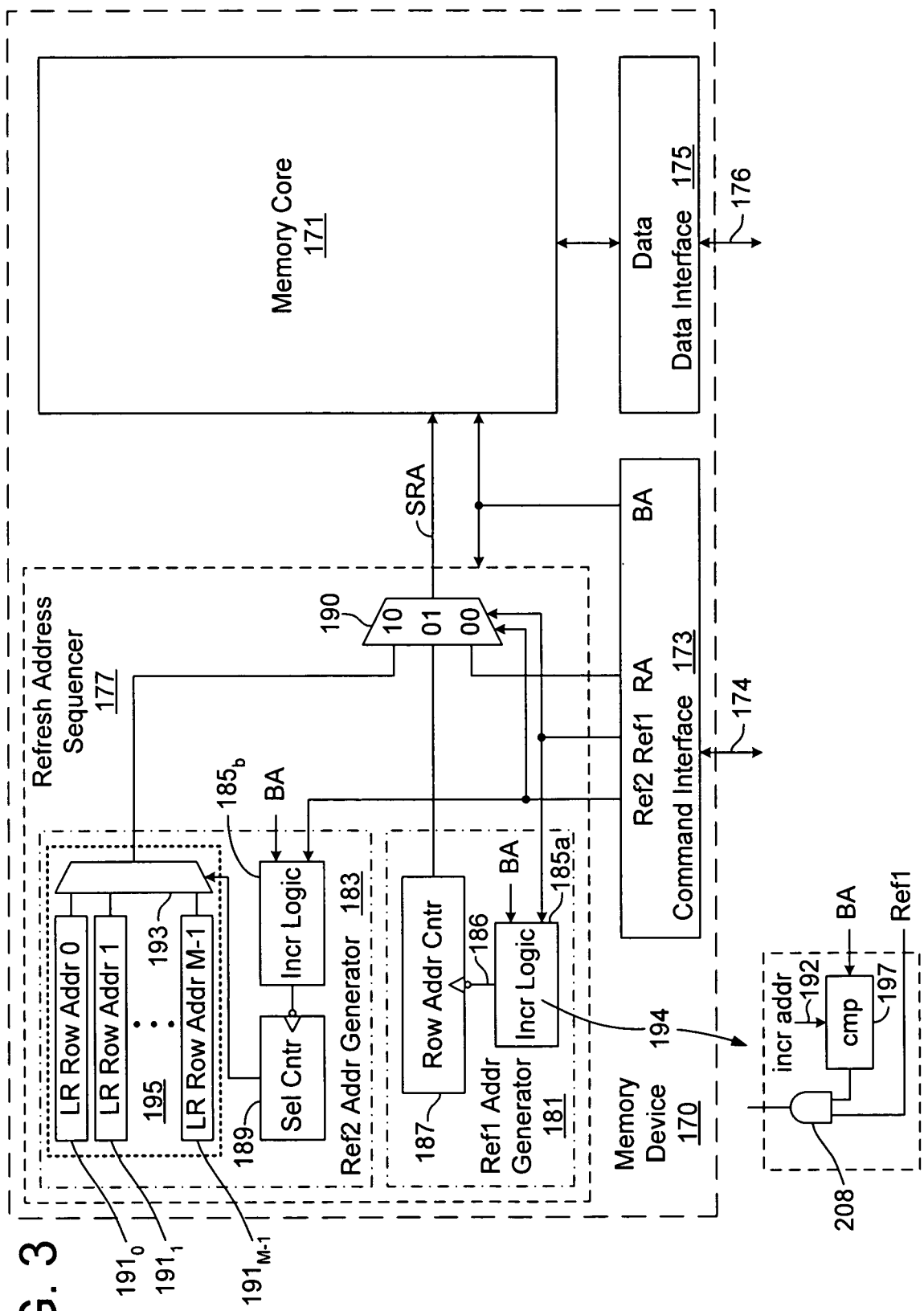
FIG. 3 illustrates an embodiment of a memory device that supports differentiated refresh rates for normal-retention and low-retention storage rows.

FIG. 3 illustrates an embodiment of a dynamic random access memory device 170 that supports differentiated refresh rates for normal-retention and low-retention storage rows. The memory device 170 includes a memory core 171, command interface 173, data interface 175 and refresh address sequencer 177. The command interface 173 is coupled to a command path 174 to receive memory access commands (e.g., read and write commands), control commands (e.g., refresh commands), configuration commands and requests to read configuration information or other status information, and includes logic for outputting control signals to other components of the memory device 170 to carry out the commanded operations. The data interface 175 is coupled to a data path 176 to receive write data and configuration data associated with memory write and configuration commands, and to transmit read data and configuration information in response to memory read and status read commands. In one embodiment, addressing information associated with memory access and configuration commands and, optionally, with refresh commands is received via the command path 174, though such information or any portion thereof may alternatively be received via a dedicated address path and/or data path 176.

Though not specifically shown, the memory core 171 includes row decode circuitry for accessing address-specified rows of storage cells and column decode circuitry for accessing address-specified portions (columns) of data retrieved from selected rows. In one embodiment, storage cells are organized in multiple separately addressable banks within the memory core 171, and the memory core 171 additionally includes bank decode circuitry for accessing an address-specified bank. In such an embodiment, addressing information associated with memory access commands generally includes bank, row and column address components for resolving the memory access to a desired data storage location.

With respect to refresh operations, the memory device 170 may be operated in one of at least two modes: an auto-refresh mode in which externally-supplied refresh commands are used to initiate corresponding refresh operations, and a self-refresh mode in which control circuitry within the command interface 173 or elsewhere within the memory device 170 initiates refresh operations, for example, by issuing control and address signals that correspond to control and address signals generated in response to externally-supplied refresh commands. In general, the self-refresh mode may be viewed as an emulation of the auto-refresh mode, with address sequencing and/or command generation otherwise performed in a memory controller being performed instead by counterpart circuitry within the memory device 170. Accordingly, each of the various functions described herein as being performed by circuitry within the memory controller or other external control device to effect differentiated refresh rates within memory device 170 may, in the self-refresh mode, be carried out by corresponding circuitry within the memory device itself.

In the particular embodiment of FIG. 3, refresh operations are performed one at a time in each row of each bank of the memory device 170, with the row address sequenced (i.e. stepped through in a predetermined sequence) by the refresh address sequencer 177 and the bank address sequenced by a memory controller. By this arrangement, the memory controller may schedule refresh operations directed to different banks in an order that increases operational concurrency (e.g., enabling a memory read or write access to be carried out in one bank concurrently with a refresh operation in another bank). Each refresh operation is carried out in a respective time interval referred to herein as a refresh window and may be initiated in response to either of the two types of refresh commands described above: primary refresh commands and secondary refresh commands. The command interface 173 decodes incoming commands and, upon detecting a primary refresh command or secondary refresh command (e.g., each signaled by particular timing of address strobe signals and/or combination of command signals), asserts a primary refresh signal (Ref1) or secondary refresh signal (Ref2), respectively, both of which are supplied to the refresh address sequencer 177.

In the embodiment of FIG. 3, the refresh address sequencer 177 includes a primary refresh address generator 181, secondary refresh address generator 183 and row address multiplexer 190. The row address multiplexer 190 is provided to select either primary refresh address generator 181, secondary refresh address generator 183 or command interface 173 as the source of a selected row address (SRA) delivered to the memory core 171 for a given row operation (e.g., an activation operation in which contents of the addressed row are transferred to a sense amplifier bank for refresh purposes, or to enable read/write operations to be carried out in address-selected columns of the sense amplifiers). More specifically, in a memory access directed to a given storage row, the primary and secondary refresh signals (Ref1, Ref2) are both deasserted (e.g., driven low) so that row address multiplexer 190 selects a row address (RA) provided in an association with a memory access command to be the selected row address. By contrast, when a primary or secondary refresh command is received, either the primary refresh signal (Ref1) or secondary refresh signal (Ref2) will be asserted to select, via row address multiplexer 190, either primary refresh address generator 181 or secondary refresh address generator 183, respectively, to source the selected row address.

In the embodiment of FIG. 3, the primary refresh address generator 181 includes a row address counter 187 to generate an incremental sequence of row addresses, and increment logic 185a to increment the row address counter 187 upon detecting that the current count value (i.e., value maintained within the row address counter 187) has been applied in a refresh operation directed to each storage bank within the memory core 171. In one implementation, shown in detail view 194 for example, the increment logic 185a includes a comparator 197 having inputs to receive a bank address (BA) from the command interface 173 and an increment address 192 ("incr addr"), and an output coupled to a first input of an AND gate 208. The second input of the AND gate 208 is coupled to receive the primary refresh signal, Ref1. By this arrangement, when the bank address (which may be sourced by a memory controller or, in self-refresh mode, by a bank address counter within the command interface 173 or elsewhere within the memory device 170) matches the increment address 192 and the primary refresh signal is asserted, the increment logic raises an increment signal 186. The increment signal 186 is supplied to an inverting count-strobe input of the row address counter 187 so that, when the increment signal 186 goes low (i.e., after the refresh operation is completed or at least after the selected row address has been latched within the memory core 171 or is otherwise unneeded), the row address counter 187 is incremented to the next row address in the sequence.

In one embodiment, the row address counter 187 generates an ordinal sequence of row addresses (e.g., incremented by one or negative one at each falling edge of the increment signal 186). In other embodiments, the row address counter 187 may produce other progressions of row addresses, for example, by incrementing the count value by an odd number greater than two in response to each falling edge of the increment signal 186. Also, within the increment logic 185a, the increment address 192 may be a fixed address (e.g., where the controller is expected to issue bank addresses in a predetermined order) or may be an address determined by a logic circuit (not shown). For example, in one embodiment, the increment address 192 is provided by an elimination logic circuit that performs a process-of-elimination function, changing the increment address 192 to a bank address (BA) not yet applied in a primary refresh operation at the current row count value until only a final bank address remains. In such an embodiment, bank addresses (BA) may be supplied by the memory controller in any order, with the row address counter being incremented only after a full complement of bank addresses (i.e., bank addresses directed to each of the different banks within the memory core 171) has been received.

In one embodiment, the secondary refresh address generator 183 includes increment logic 185b (e.g., implemented in the same manner as increment logic 185a), a select counter 189, and a lookup table 195 formed by multiplexer 193 and storage registers $191_0$-$191_{M-1}$. The storage registers $191_0$-$191_{M-1}$ are provided to hold the row addresses of a number (M) of low-retention storage rows within the memory core 171 and may be implemented, for example, by volatile storage elements (e.g., collections of bi-stable latch elements or flip-flops) that are loaded with addresses of the low-retention storage rows during system initialization (e.g., the low-retention row addresses being retrieved from a serial presence detect or other non-volatile storage) or by non-volatile elements (e.g., fuse-programmable elements or other programmable elements) that are production-time programmed with the low-retention row addresses. In either case, the contents of storage registers $191_0$-$191_{M-1}$ (i.e., the low-retention row addresses) are supplied to respective input ports of multiplexer 193 which additionally includes a select-input coupled to receive a select value from the select counter 189. By this arrangement, as the select counter 189 is sequenced from 0 to M-1, each of the storage registers $191_0$-$191_{M-1}$ is selected in turn to supply a row address to be used in a secondary refresh operation.

In one embodiment, the lookup table 195 is implemented by programmable elements (e.g., volatile or non-volatile elements as discussed above) arranged in rows and columns, with each row of the programmable elements coupled to a respective one of M word lines and with columns of the programmable elements coupled, via respective bit lines (or pairs of bit lines), to an input port of row address multiplexer 190 (i.e., the port marked '10' in FIG. 3). In such an embodiment, the select counter 189 may include a decoder circuit to decode the select count value (i.e., the count value maintained by the select counter) and thus activate a count-indicated one of the M word lines to enable the low-retention storage row address stored in the corresponding row of programmable elements to be output onto the bit lines and therefore to row address multiplexer 190. In such an embodiment, one or more access transistors within each programmable element (e.g., a transistor coupled between a bit line and a data node of a programmable element and having a gate terminal coupled to the corresponding word line) collectively form multiplexer 193.

In one embodiment, memory device 170 is applied in a memory system in which the memory controller is unaware of the bank address to be supplied in conjunction with a given secondary refresh command (e.g., the memory controller receives no information regarding the storage banks in which low-retention rows reside). Consequently, the memory controller may output, in response to each secondary refresh request signal (e.g., signal 146 of FIG. 2A), a sequence of secondary refresh commands each having a respective bank address to effect a secondary refresh operation in each bank of the memory core 171 for a given low-retention row address. By this operation, each row address output from the primary and secondary refresh address generators may be viewed, at least for refresh purposes, as spanning all the banks of the memory core 171.

Reflecting on the refresh address sequencer of FIG. 3, it can be seen that the primary refresh address generator 181 will cycle through all N row addresses (i.e., the addresses of all accessible storage rows) of the memory device 170 at a rate controlled by the primary refresh command frequency and similarly, that the secondary address generator 183 will cycle through the low-retention row addresses at a rate controlled by the secondary refresh command frequency. Accordingly, by programming the memory controller to issue NB (i.e., N times B) primary refresh commands per tREF interval, where B is the number of banks, and to issue MKB secondary refresh commands per tREF interval (M being the number of low retention storage rows within memory device 170 and K being the desired ratio between secondary and primary refresh rates), and by sequencing the bank address in each set of B primary refresh commands and in each set of B secondary refresh commands, each of the normal-retention storage rows will be refreshed at least once per tREF interval, and each of the low-retention storage rows will be refreshed at least once per tREF/K interval. Because primary refresh commands are applied to all N row addresses, including addresses of low-retention rows, and because secondary refresh-commands are applied to all banks, including those which may have as many as B−1 normal-retention storage rows at the row address output by the secondary refresh address generator 183, some redundant refreshing may occur in low-retention and normal-retention rows. In other embodiments, described below, circuitry may be provided in the memory controller and/or memory device to reduce or eliminate redundant refreshing.

Still referring to FIG. 3, it should be noted that, in an alternative embodiment, the refresh address sequencer 177 may be removed to the memory controller, simplifying the memory device architecture and enabling bank and row addresses to be supplied by the memory controller along with primary and secondary refresh commands. In such an embodiment, a record of low-retention row addresses may be programmed within the memory device or associated non-volatile storage at device production time, then read by the memory controller in an initialization operation (i.e., the addresses being used to populate an instance of the lookup table 195 within the memory controller). Alternatively, the low-retention row addresses may be programmed into a non-volatile storage within the memory controller itself.

Figure 4:
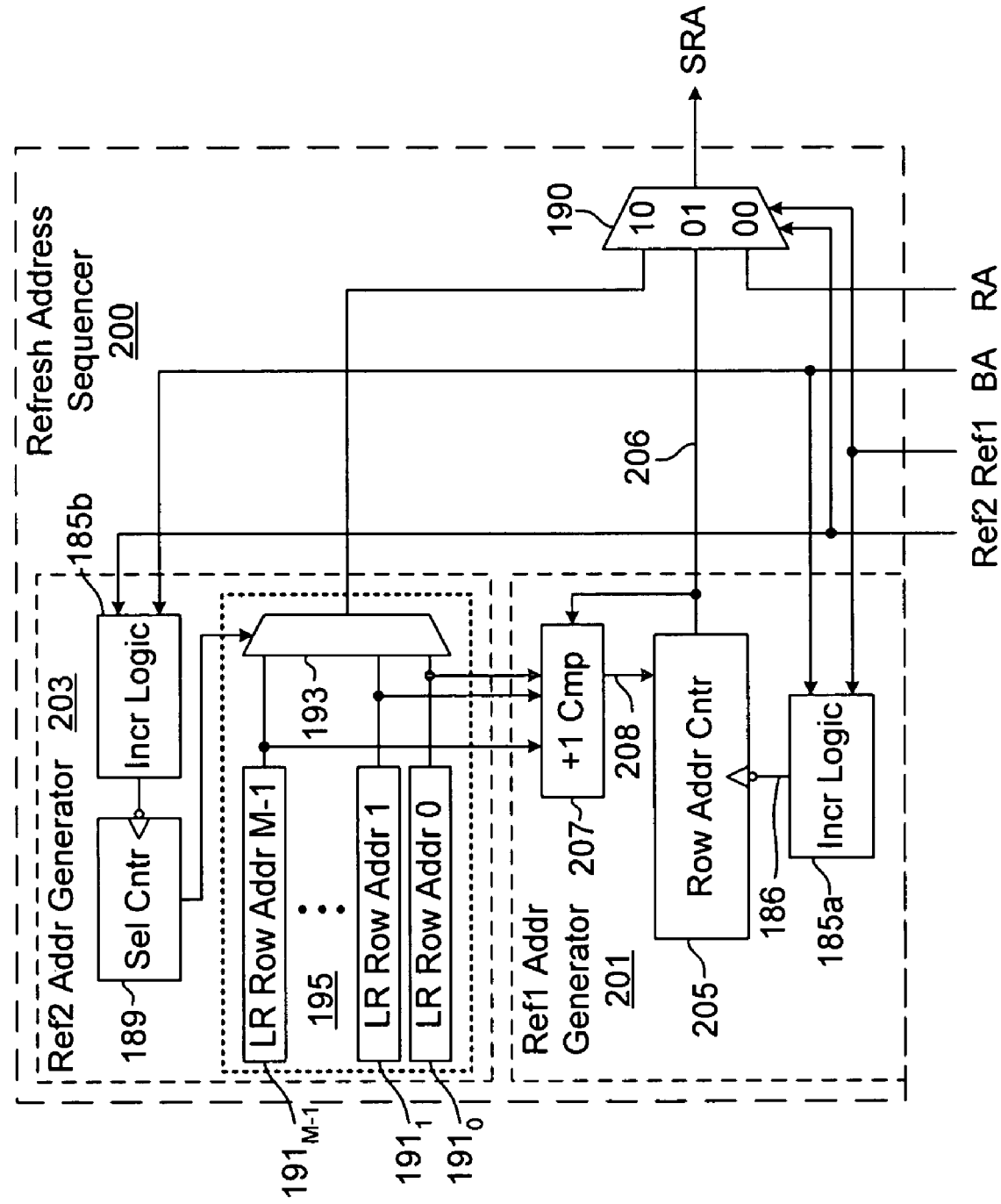
FIG. 4 illustrates an alternative embodiment of a refresh address sequencer that may be used within the memory device of FIG. 3.

FIG. 4 illustrates an alternative embodiment of a refresh address sequencer 200 having a secondary refresh address generator 203 and row address multiplexer 190 that operate generally as described in reference to FIG. 3, and a modified primary refresh address generator 201. More specifically, the primary refresh address generator 201 includes, in addition to increment logic 185a, a modified row address counter 205 and a compare circuit 207 for comparing the row count value 206 output from row address counter 205 with each of the low-retention row addresses stored in lookup table 195. More specifically, the compare circuit 207 includes combinatorial logic to produce an incremented instance of the row count value 206 (i.e., row count+1) and to compare the incremented row count with each of the low-retention row addresses. If the compare circuit detects a match between the incremented row count and one of the low-retention row addresses, the compare circuit asserts a skip signal 208 to cause the row address counter 205 to be incremented by two, instead of one, at the next falling edge of the increment signal 186, thereby skipping over any row address that is recorded in lookup table 195. If the incremented row count does not match any of the low-retention row addresses from lookup table 195, the skip signal 208 is deasserted to enable the row address counter to be incremented by one. By this operation, primary refresh operations (i.e., refresh operations initiated in response to primary refresh commands) directed to low-retention storage rows may be avoided, thus reducing redundant refreshing. Accordingly, because primary refresh commands are not applied to refresh low-retention rows, the memory controller may be programmed to generate (N−M)B primary refresh commands, instead of NB primary refresh commands, thus lowering refresh overhead. In embodiments where the row count increment is negative and/or a value greater than one, the combinatorial logic within the compare circuit 207 may be rearranged accordingly to provide the desired comparison between the anticipated row count value and low-retention row addresses, and the row counter 205 modified to produce twice the row count increment in response to assertion of the skip signal 208. Also, as discussed in reference to FIG. 3, the refresh address sequencer 200 may alternatively be disposed within a memory controller to enable generation of row addresses to be output in association with primary and secondary refresh commands.

It should be noted that the number of row address values stored in the lookup tables 195 of the secondary address generators of FIGS. 3 and 4 may be a predetermined number, M. That is, rather than reading a device-dependent value of M from a memory device or associated non-volatile storage, the value of M may be fixed at a predetermined number to accommodate all such memory devices having M or fewer low-retention rows. In such an embodiment, the fixed value of M may be recorded in a serial presence detect or other nonvolatile storage, or may be inferred based on other information such as a memory device part number, memory module part number or the like recorded in the serial presence detect or other non-volatile storage. In memory devices having fewer than M low-retention rows, unused storage registers 191 within lookup table 195 may be marked as containing invalid entries (e.g., by clearing a validity bit in each unused register or storing an out-of-range address value) to prevent unused storage registers 191 from being selected to source refresh addresses (or to prevent refresh operations from being performed in response to secondary refresh commands that result in selection of an unused register 191), or may be loaded with a predetermined or arbitrary address, in either case incurring a limited amount of redundant refreshing in exchange for obviating the circuitry or non-volatile storage otherwise needed to provide the actual number of low-retention rows within each memory device.

Figure 5:
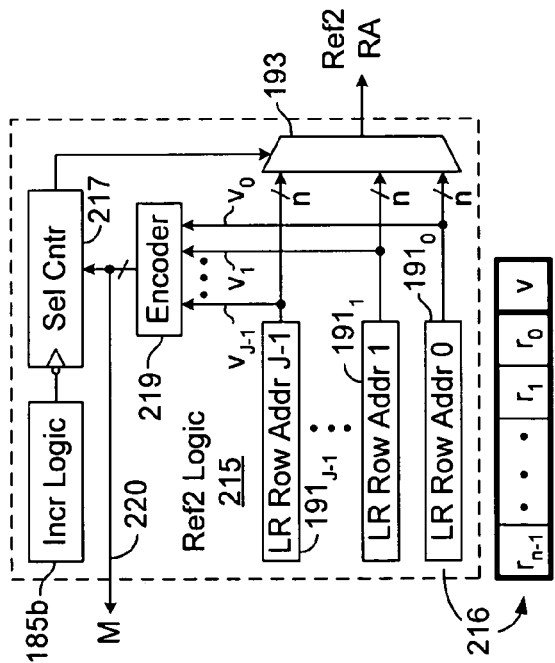
FIG. 5 illustrates an embodiment of a secondary refresh address generator.

FIG. 5 illustrates an embodiment of a secondary refresh address generator 215 having K storage registers $191_0$-$191_K$ each containing n+1 bit-storage elements 216 to enable storage of both an n-bit row address r[n−1:0] and a validity bit, 'v', that indicates whether the counterpart n-bit row address is valid. In one embodiment, for example, the validity bit is low if a low-retention row address has been stored (or programmed) within the corresponding row storage elements and high otherwise. The n-bit row addresses are supplied to respective input ports of a multiplexer 193 as described in reference to FIG. 3, and the validity bits are supplied to an encoder 219 which, in turn, generates an encoded, numeric representation of the number of the low validity bits and therefore a low-retention row count, M (220), that indicates the number of low-retention storage rows within the memory device. In one embodiment, the storage registers $191_0$-$191_{J-1}$ are loaded in order starting at either the highest or lowest numbered storage register so that the low-retention row count may be used to control the maximum or minimum select count generated by select counter 217, thereby enabling the secondary refresh address generator 215 to bypass invalid entries within registers 191 and generate a repeating sequence of the M valid low-retention row addresses. The low-retention row count 220 may also be provided to an output multiplexer (not shown) to be multiplexed onto an output path (e.g., the data path 176 of FIG. 3) in response to a command to the low-retention row count. By this arrangement, a memory controller or other control device may read the low-retention row count 220 for configuration purposes (e.g., to program the primary and secondary refresh command frequencies as described in reference to FIG. 2).

Figure 6:
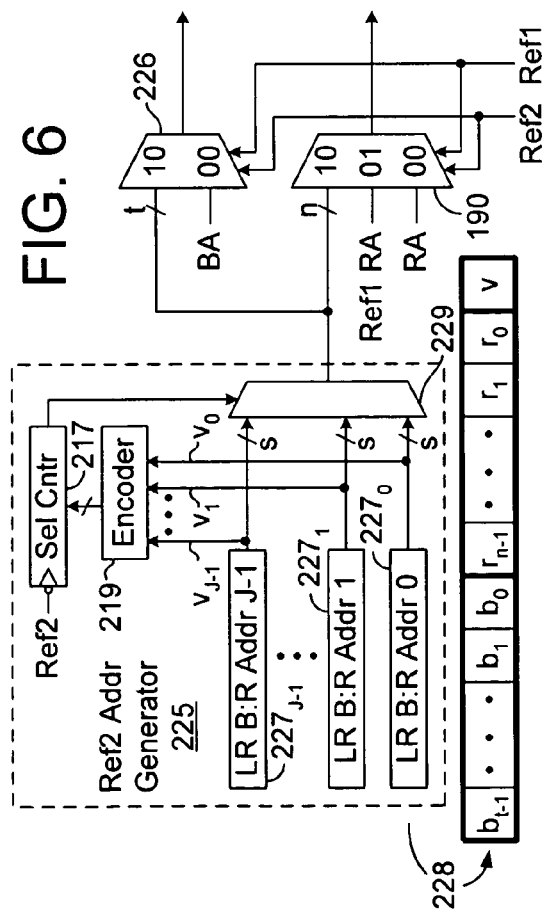
FIG. 6 illustrates another embodiment of a secondary refresh address generator.

FIG. 6 illustrates another embodiment of a secondary refresh address generator 225 having storage registers $227_0$-$227_{J-1}$ each containing storage elements as shown at 228 for storing both the row address, r[n−1:0], and bank address, b[t−1:0], of a low-retention row, thus enabling secondary refresh operations to be limited to the specific storage bank containing a low retention row and thus preventing redundant refreshing of normal-retention rows that share a low-retention row address but reside in different banks. The full s-bit address value (s=n+t) of a selected storage register 227 (i.e., selected by operation of an encoder, 219, select counter and multiplexer 229 generally as described in reference to FIG. 5) is output to row and bank address multiplexers 190, 226 where they are conditionally selected for delivery to the memory core (not shown). More specifically, the n-bit row address component of each recorded address is supplied to row address multiplexer 190 as described in reference to FIGS. 3 and 4, and the t-bit bank address component is supplied to a bank address multiplexer 226 that selects the recorded bank address, b[t−1:0], to be output to the memory core in a secondary refresh operation, and an incoming (or self-generated) bank address (BA) to be output to the memory core in a primary refresh operation or memory access operation.

Still referring to FIG. 6, because bank addresses need not be accounted for in sequencing through the low-retention row addresses, the increment logic 185b of FIG. 5 may be omitted and the select counter 217 incremented instead by the falling edge of the secondary refresh signal, Ref2. In an alternative embodiment, the encoder 219 may also be omitted so that the select counter sequences through all of the storage registers 227 as described in reference to FIGS. 3 and 4.

Figure 7:
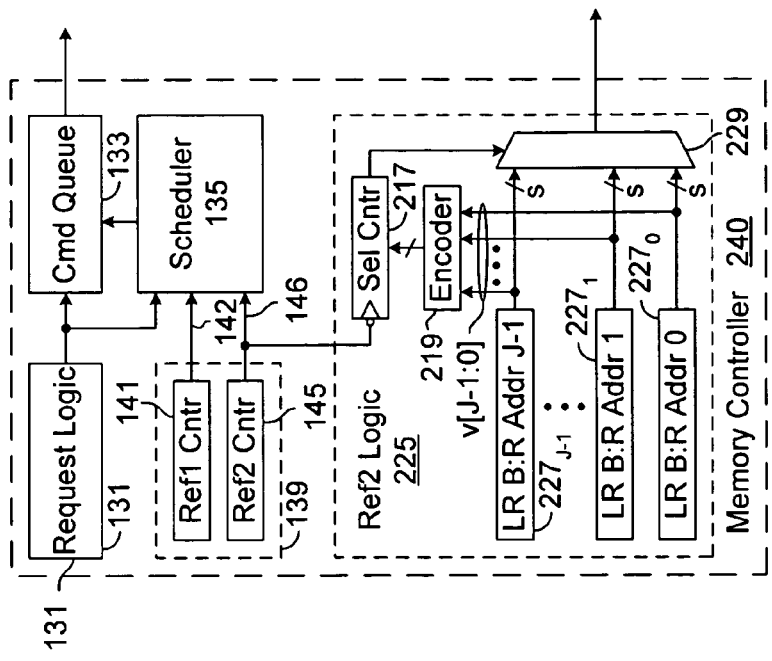
FIG. 7 illustrates an embodiment of a memory controller that includes the secondary refresh address generator of FIG. 6.

FIG. 7 illustrates an embodiment of a memory controller 240 that includes the secondary refresh address generator 225 of FIG. 6. The secondary refresh address generator 225 may be used to supply bank and row address values to be output in association with row activation and precharge commands, thus effecting secondary refresh operations within the recipient memory device without having to include a secondary refresh address generator or control circuitry within the memory device for responding to secondary refresh command types. Primary refresh commands may be issued with an associated bank address only and the refresh row address provided by a primary refresh address generator as described in reference to FIG. 3. By this arrangement, an accelerated refresh rate may be achieved in low-retention rows without having to provide circuitry within the memory device for decoding (or otherwise processing) secondary refresh commands or circuitry for generating secondary refresh address information. Also, the scheduler 135 (which contends with request logic 131 for arbitrated access to command queue 133) may keep track of the row address and bank address to be refreshed in response to each assertion of the primary refresh request signal and thus may skip over such address in response to determining that the row address and bank address match a valid low-retention row address within storage registers $227_0$-$227_{J-1}$. In another embodiment, the memory controller 240 may include a primary row address generator and thus supply a row address and bank address to be output in association with each primary refresh command. In such an embodiment, the row address and bank address to be output in association with a given primary refresh command may be compared with contents of storage registers $227_0$-$227_{J-1}$ to skip over low-retention rows and thus avoid redundant refreshing.

3. Algorithmic Address Sequencing

Figure 8B:
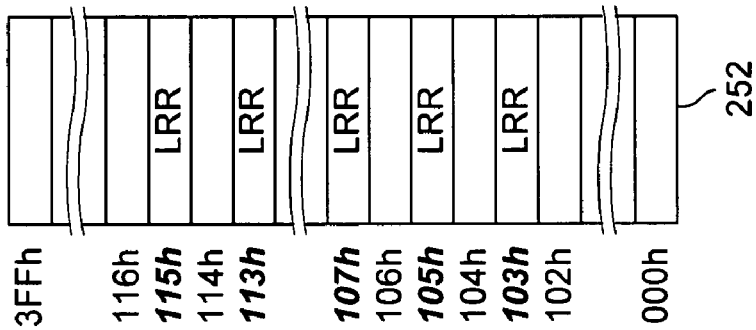
FIGS. 8A and 8B illustrate exemplary storage arrays having low-retention storage rows disposed at addresses encompassed by an algorithmically generated address sequence.
Figure 8A:
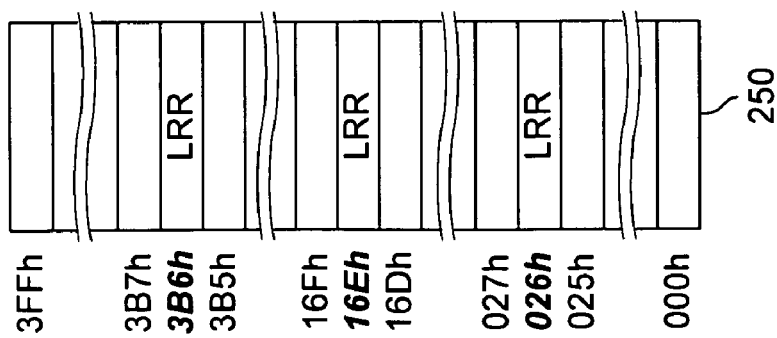

As discussed above, laser-programmable fuses or other types of one-time programmable elements may be used to record retention information (i.e., information indicative of low-retention addresses) in memory devices and/or a memory controller. Unfortunately, such programmable elements tend to be relatively large and may thus consume considerable die area to provide storage for a desired number of low-retention row addresses. In a number of embodiments, the number of programmable elements required to indicate the addresses of low-retention rows may be reduced by recording retention information in the form of a sequence descriptor that specifies an algorithmically generated address sequence that encompasses all the low-retention row addresses within a given memory device or set of memory devices. In the storage array 250 illustrated in FIG. 8A, for example, low-retention storage rows (LRRs) are disposed at row addresses that fall within a count-by-eight pattern that starts at an initial offset of six. That is, a secondary refresh address generator that generates row addresses according to the expression: InitialOffset+ (Stepsize×Count), where InitialOffset is six, Stepsize is eight, and Count=0, 1, 2, 3, . . . , will generate a sequence of addresses that includes addresses 026h, 16Eh and 3B6h ('h' denoting hexadecimal notation), the addresses of the three low-retention rows. Assuming that a sequence descriptor that specifies the InitialOffset and Stepsize in a relatively small number of programmable elements, substantial die area savings may be realized relative to an embodiment that provides programmable elements to store explicit addresses of low-retention storage rows in exchange for potentially redundant refreshing at some storage locations.

The algorithmically generated sequence of row addresses may additionally be bounded to limit the address sequence to a particular range and thus take advantage of failure locality to limit redundant refreshing. The storage array 252 shown in FIG. 8B, for example, includes five low-retention storage rows concentrated within a relatively small address range from 103h to 115h. Accordingly, a secondary refresh address generator that initializes an address counter to a start address of 103h, increments the address counter by a Stepsize of two, and resets the address counter to the start address upon detecting that the count value exceeds 114h (i.e., one past the end address of 115h less the Stepsize) will generate a repeating sequence of ten addresses that include the five low-retention row addresses.

Figure 9:
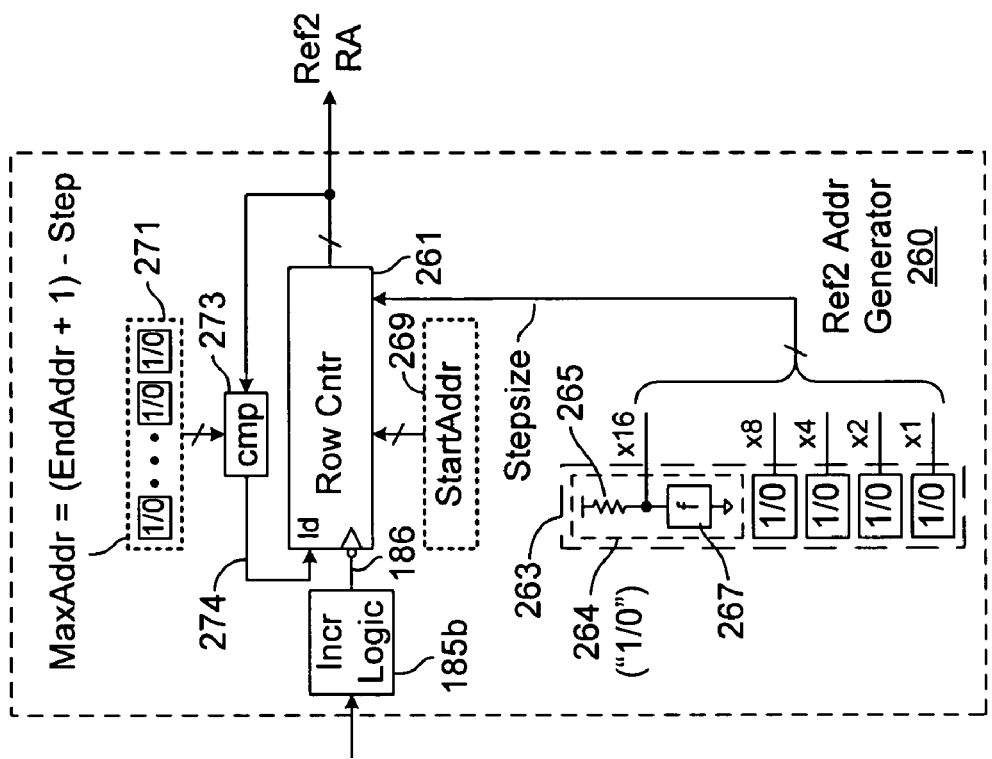
FIG. 9 illustrates an exemplary embodiment of a secondary refresh address generator that may be programmed to produce various algorithmically generated address sequences.

FIG. 9 illustrates an exemplary embodiment of a secondary refresh address generator 260 that may be programmed to produce various algorithmically generated address sequences. The secondary refresh address generator 260 includes a row address counter 261, increment logic 185b, and comparator 273, together with a programmable register having bit fields 263, 269 and 271 for storing, respectively, a step size value (Stepsize), start address (StartAddr) and maximum address (MaxAddr). In one embodiment, each of the bit fields 263, 269, 271 is formed by a set of one or more programmable elements 264 ("1/0") implemented, for example, by a laser-programmable fuse element 267 and resistive element 265 coupled in series between ground and supply nodes. By this arrangement, if fuse element 267 is left intact, the output of a programmable element 264 is pulled down to produce a logic low signal and, if fuse element 267 is blown (e.g., in a production-time programming operation), the output is pulled up through resistive element 265 to produce a logic high signal. Note that the resistive element 265 may be implemented by any combination of active and/or passive elements. More generally, any element that may be programmed to yield a desired logic-level signal may be used in place of programmable elements 264 in alternative embodiments.

The Stepsize value is provided to row address counter 261 to control the size of the count increment that occurs at each falling edge of increment signal 186. In one embodiment, for example, the row address counter 261 includes a combinatorial circuit to effect a count-by-Stepsize operation. In the particular embodiment shown, step sizes of 1, 2, 4, 8 and 16 may be selected by programming corresponding bits within bit field 263. Additional and/or different step sizes may be accommodated in alternative embodiments including, without limitation, non-power-of-two step sizes and odd-valued step sizes. Also, an encoded value may be recorded within bit field 263 rather than the fully decoded step size value shown in FIG. 9.

In one embodiment, the start address and maximum address fields 269, 271 are used to limit the range of address values output by the row address counter 261. That is, the row address counter 261 is initially loaded with the start address value, StartAddr, and then incremented according to the Stepsize value in response to each falling edge of the increment signal 186. The resulting count value is output from the row address counter 261 as the secondary refresh row address (Ref2 RA) and is also supplied to comparator 273 for comparison with the maximum address value, MaxAddr. If the count value exceeds the maximum address (programmed, for example, to be one past a desired end address less the step size as discussed above), the comparator 273 asserts a load signal 274 to reload StartAddr into the row address counter 261 at the next falling edge of the increment signal 186. Thus, by programming a desired sequence descriptor within bit fields 263, 269 and 271 (e.g., Stepsize, StartAddr and MaxAddr), the secondary refresh address generator 260 may be configured to generate numerous different address patterns. Also, by making the sequence descriptor accessible to the memory controller or host device (e.g., outputting the sequence descriptor in response to a status or confirmation read command), the total number of addresses in the algorithmically generated sequence may be determined, thereby enabling refresh logic within the memory controller to be programmed with values that yield desired rates of primary and secondary refresh commands.

With respect to determining the sequence descriptor to be programmed within secondary refresh address generator 260, in one embodiment low-retention row addresses identified during device testing operations (described below) may be provided to a computing device that determines the sequence descriptor of the shortest algorithmically generated address sequence that encompasses all the low-retention row addresses. The sequence descriptor may then be programmed within the memory device or associated non-volatile storage. In the latter case the sequence descriptor may be read from the non-volatile storage (e.g., a serial presence detect, BIOS storage, etc.) during system initialization and loaded into a programmable register (e.g., a volatile configuration circuit provided instead of bit fields 263, 269 and 271) to control the address sequence generated by the secondary refresh address generator.

It should be noted that, from the perspective of a memory controller, any or all of the storage rows encompassed by an algorithmically generated address sequence may be low-retention storage rows. Thus, once a sequence descriptor has been recorded, unless other information is recorded to indicate the actual addresses of low-retention storage rows, all the storage rows encompassed by the specified address sequence are deemed to be low-retention storage rows and referred to as such herein even though one or more of the storage rows may in fact be normal-retention storage rows.

Still referring to FIG. 9, one or more of the step-size, start-address and/or maximum-address bit fields 263, 269, 271 may be omitted in alternative embodiments. In one such embodiment, for example, the maximum address bit field 271 is omitted and the start address bit field 269 is replaced by an initial offset field that may be used to establish a fixed state of least-significant-bits (LSBs) when various step sizes are selected (e.g., per FIG. 8A, programming the three least significant bits of the row count output to be six ('110') and programming bit field 263 to provide a step size of eight). Also, various other pattern generating circuits may be used instead of the row address counter 261. In one embodiment, for example, a pseudo-random number generator (e.g., implemented by a linear-feedback shift register) may be programmably seeded, bounded and/or tapped (i.e., having programmably selected feedback taps) to generate a predetermined pattern of addresses that encompasses the addresses of all low-retention storage rows within the memory device. A sequence descriptor that specifies the seeding, bounding and/or tap configuration may be retrieved from the memory device to determine the number of addresses in the algorithmically generated sequence and thus used to program the refresh logic within a memory controller. More generally, any circuit arrangement that may be programmed to generate a deterministic sequence of address values may be used to implement a secondary refresh address generator. Also, while secondary refresh address generator 260 has been described in terms of generating a pattern of row addresses, the secondary refresh address generator 260 may additionally generate a pattern of bank addresses. In such an embodiment, the increment logic 185*b* may be omitted and a secondary refresh signal used to directly step the secondary refresh address generator 260 through an algorithmically generated address sequence. Further, the secondary refresh address generator 260 of FIG. 9 (or other algorithmic sequence generator) may be included within a memory controller instead of a memory device.

4. Uniform Refresh Command Type

Figure 10:
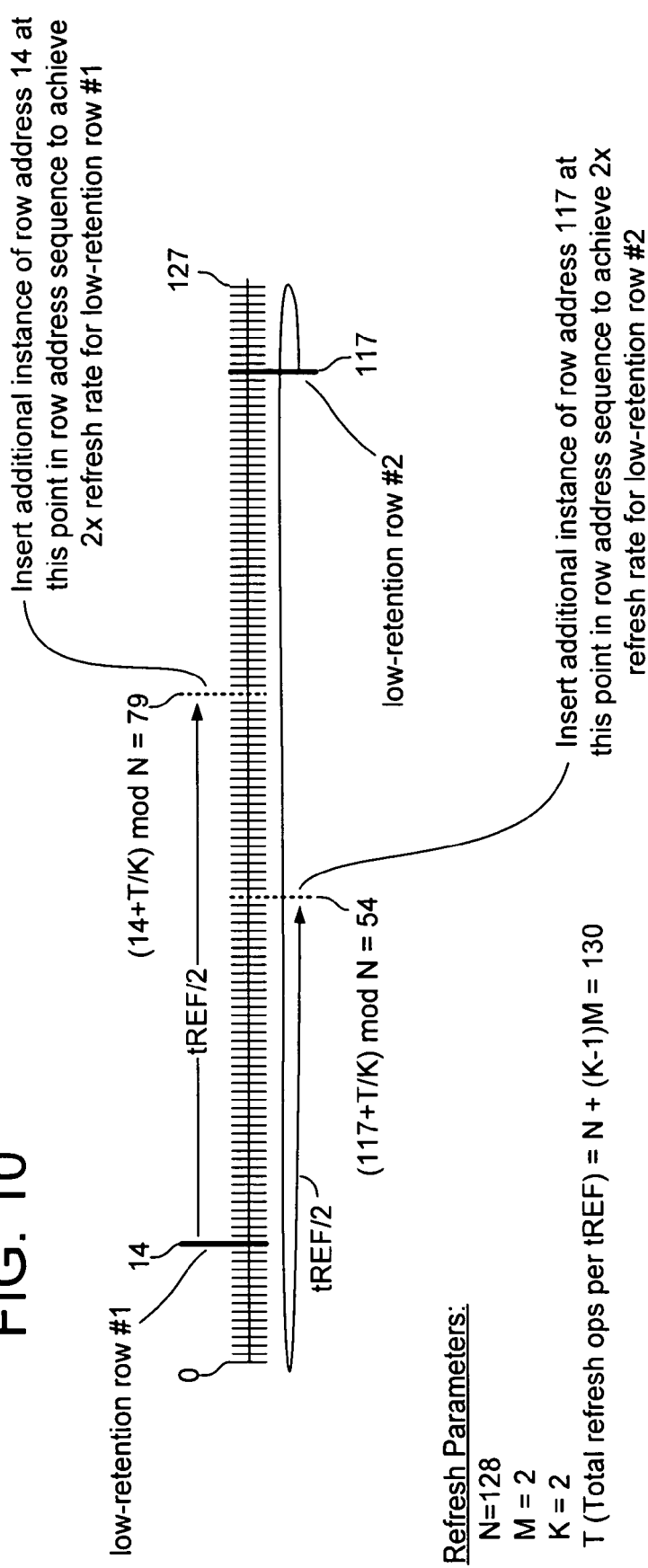
FIG. 10 illustrates a technique for effecting address-differentiated refresh rates in a memory device without resorting to differentiated refresh command types.

FIG. 10 illustrates a technique for effecting address-differentiated refresh rates in a memory device without resorting to differentiated refresh command types. That is, in contrast to the embodiments described in reference to FIGS. 2-9 in which primary and secondary refresh commands are used to advance through respective sequences of row addresses, a uniform refresh command type (referred to simply as a refresh command) may be used to control the progression through a sequence of row addresses that includes a single instance of each normal-retention row address and two or more instances of each low-retention row address.

In the specific example shown in FIG. 10, a memory device is assumed to have 128 accessible storage rows (N=128), including first and second low retention rows at addresses 14 and 117, respectively (M=2). Additionally, for purposes of example, the low-retention rows are assumed to require refreshing at twice the primary refresh rate (K=2). Thus, the total number of refresh operations (T) required during each tREF interval is N+(K−1)M=130.

Observing that each storage row in the memory device will be refreshed in order of address in an embodiment that generates an ordinal sequence of refresh addresses (i.e., 0, 1, 2, . . . 127, 0, 1, 2, . . . ), it follows that a 2× refresh rate may be achieved for any low-retention row by inserting an additional instance of the low-retention row address into the address sequence at a point midway between successive occurrences of the low-retention row address in the ordinal sequence; that is, at the refresh window otherwise allocated to a storage row having an address that is offset from the low-retention row address by N/2. To be precise, because the total number of refresh addresses to be sequenced during a given tREF interval is increased from N to T by insertion of additional instances of low-retention row addresses in the sequence, the midway time between successive occurrences of a low-retention row address in the ordinal sequence occurs when the sequence is incremented to a midpoint address given by: (low-retention row address+T/2) modulus N; the modulus operation to account for sequence rollover at N−1. Thus, by inserting an additional instance of the low-retention row address ahead of such midpoint row address (which may be a one-third way (T/3) address, one-fourth-way (T/4) address, etc., depending on the value of K), an additional refresh of the low-retention row will be performed at the time necessary to effect a 2× refresh rate for the low-retention storage row. Thus, as shown in FIG. 10, by modifying the ordinal sequence of row addresses to include an additional instance of address 14 at the refresh window that corresponds to a first midway row address 79 (i.e., 14+(130/2) mod 128), and to include an additional instance of address 117 at the refresh window that corresponds to a second midway address 54 (i.e., 117+(130/2) mod 128), a 2× refresh rate may be effected for the low-retention rows at addresses 14 and 117, and a 1× refresh rate (i.e., one refresh per tREF interval) effected for each of the normal-retention rows.

Still referring to FIG. 10, because a uniform refresh command type is used to refresh both low-retention and normal-retention storage rows, the memory controller may be simplified by omitting circuitry otherwise used to generate secondary refresh requests, and the desired refresh command rate may be effected by programming the remaining refresh request logic to deliver T=N+M(K−1) refresh commands to a given memory device (or set of memory devices) in each tREF interval. For example, in memory controller 121 of FIG. 2A, secondary refresh counter 145, count range storage 147 and associated logic within scheduler 135 may be omitted. Further, the values of M and/or K may be read from the memory device or associated storage (or programmed within the memory controller itself or other system storage) and used to determine a count range for the primary refresh counter 141. For example, in an embodiment in which the memory controller 121 bursts a set of refresh operations to each of B storage banks within a memory device or group of memory devices in response to each assertion of primary refresh signal 142, the primary refresh counter 141 may be programmed with a count range set to cps×tREF×B/T. Other values may be programmed as necessary to provide the requisite number of refresh commands in alternative embodiments.

Figure 11B:
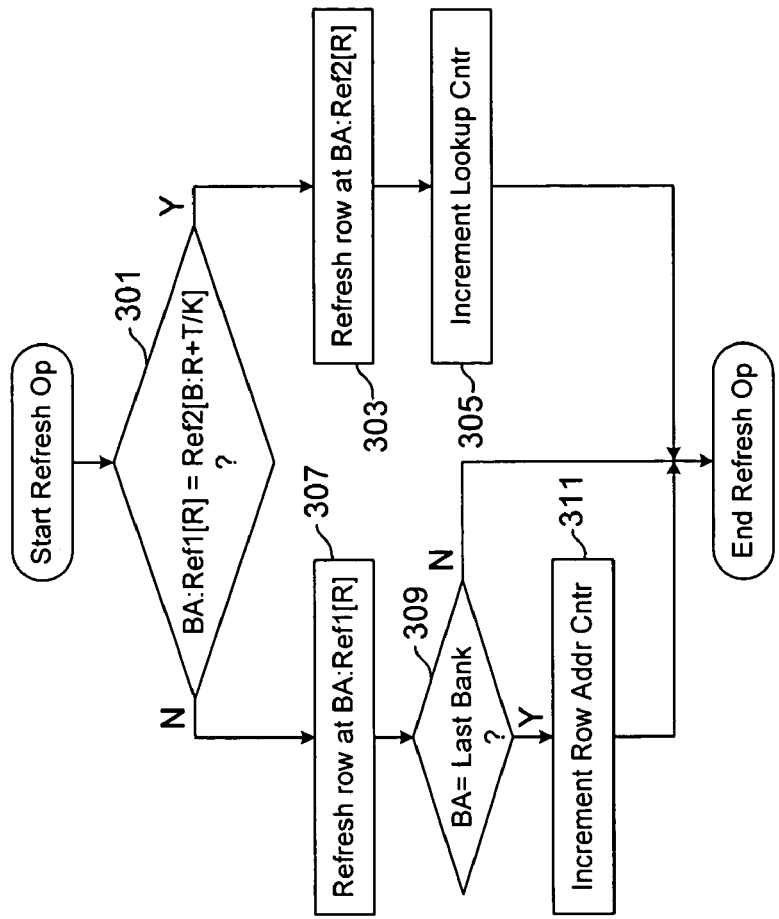
FIG. 11B illustrates the operation of the finite state machine within the refresh address sequencer of FIG. 11A according to one embodiment.
Figure 11A:
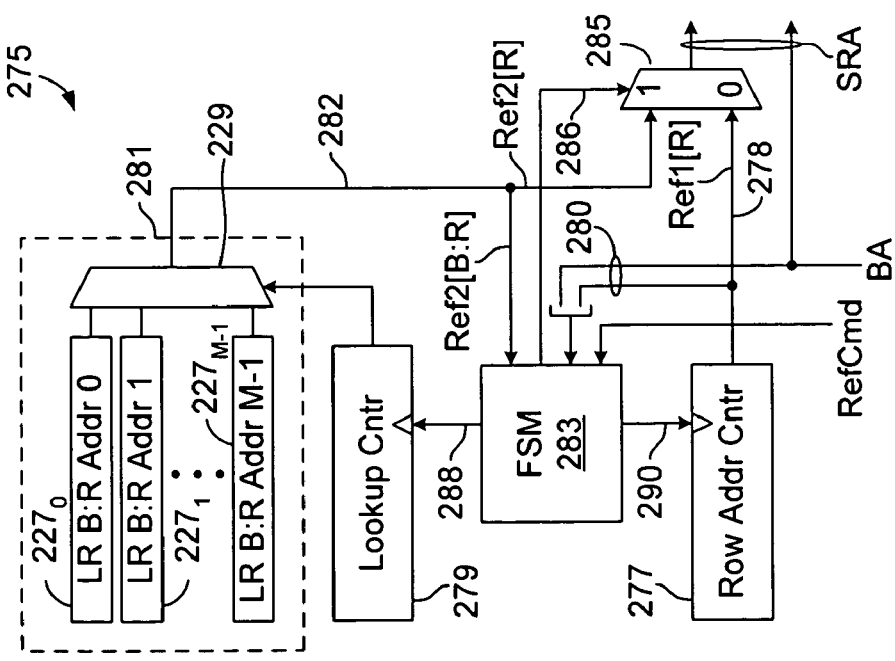
FIG. 11A illustrates an embodiment of a refresh address sequencer that may be provided within a memory device or memory controller to effect address-differentiated refresh using a uniform refresh command type.

FIG. 11A illustrates an embodiment of a refresh address sequencer 275 that may be provided within a memory device or memory controller to effect address-differentiated refresh using a uniform refresh command type. Refresh address sequencer 275 includes a row address counter 277, lookup counter 279, lookup table 281, finite state machine 283, and refresh address multiplexer 285. In one embodiment, the lookup table 281 includes a set of storage registers 227$_0$-227$_{J-1}$ to store bank and row addresses of M low-retention storage rows (where M ranges from zero to J), with the table entries organized in ascending-address order. By this arrangement as the lookup counter 279 is sequenced, in order, from zero to M−1, progressively higher addresses of low-retention storage rows are output as a secondary refresh address 282 (Ref2[B:R]), each containing a bank address component (B) and row address component (R).

The secondary refresh address 282 is supplied to the finite state machine 283 along with a primary refresh address 280 formed by a primary row address 278 (i.e., the count value from the row address counter 277) and a bank address, BA, that is sequenced, for example, in a linear order by other logic within the memory device or memory controller. The finite state machine 283 additionally receives a refresh command signal (RefCmd) that indicates a request to perform a refresh operation and, in response, outputs a row-address select signal 286 to select, via refresh address multiplexer 285, either the primary row address (Ref1[R]) or secondary row address (i.e., row address component, Ref2[R] the secondary refresh address 282) to be output, with the bank address (BA), as a selected refresh address.

FIG. 11B illustrates the operation of the finite state machine of FIG. 11A according to one embodiment. Referring to FIGS. 11A and 11B, a refresh operation is initiated when the refresh command signal (RefCmd) is asserted and begins at 301 with a comparison of a primary refresh address 280, with a midpoint value formed by adding a T/K offset value to the row address component of the secondary refresh address 282 (i.e., Ref2[B:R+T/K]), the secondary refresh address being the value output from the lookup table 281 at the present value of the lookup counter 279. The midpoint value may be generated, for example, by combinatorial logic within the finite state machine 283 or elsewhere within the refresh address sequencer 275. Also, in embodiments where N is large and the number of low-retention rows is small, the difference between T/K and N/K may negligible (i.e., T/K is substantially equal to N/K) so that simplified logic may be used to generate an approximate midpoint value. For example, where K=2, and N is a power-of-2 value, an approximate midpoint value may be generated by complementing the most significant bit of the row address component of the secondary refresh address 282.

If the primary refresh address matches the midpoint value, then an instance of the secondary refresh address is inserted into the otherwise ordinal sequence of refresh addresses to provide an additional refresh in a low-retention storage row as shown at 303 (note that due to the equality detected in 301, R2[B:R] is equivalent to BA:R2[R]). With respect to FIG. 11A, the refresh operation at the secondary refresh address 282 is effected by raising the row-address select signal 286 to enable refresh address multiplexer 285 to output the row address component of the secondary refresh address 282 as a component of the selected refresh address. At 305, the finite state machine 283 concludes the refresh operation by asserting increment signal 288 to increment lookup counter 279, and thus advance to the next secondary refresh address in lookup table 281.

Returning to decision block 301 of FIG. 11B, if the primary refresh address does not match the midpoint value, the storage row at the primary refresh address (which may be a normal-retention or low-retention storage row) is refreshed at 307 by lowering the row-address select signal 286 to enable multiplexer 285 to output the primary row address 278. If the bank address (BA) is the last in the sequence of banks addresses (determined in decision block 309, for example, by combinatorial logic within the finite state machine 283 similar to the increment logic described in reference to FIG. 3), then at 311, the finite state machine 283 asserts increment signal 290 to increment row address counter 277 and conclude the refresh operation. If the bank address is not the last, the refresh operation is concluded without incrementing row address counter 277.

Still referring to FIGS. 11A and 11B, it should be noted that the sequence of secondary refresh addresses may be generated algorithmically (e.g., as described in reference to FIGS. 8A, 8B and 9) rather than by table lookup. Also, the lookup table 281 (or a control register within an algorithmic address generator) may be programmed at production-time or at system run-time. In the latter case, addresses of low-retention storage rows may be retrieved from a serial presence detect or other a non-volatile storage and then loaded into lookup table during system initialization (or a sequence descriptor retrieved and loaded into a control register). Moreover, the bank address component may be omitted from the low-retention row addresses recorded in the lookup table 281 (or from algorithmically generated addresses) and each row address treated as spanning all storage banks of the memory device. Further, where the refresh address sequencer 275 is included within a memory controller, refresh operations may be effected by issuing the selected refresh address along with activate and precharge commands. Also, in the lookup table embodiment of FIG. 11A, all the low-retention row addresses within the lookup table 281 may be simultaneously compared with the primary refresh address 280 (e.g., lookup table implemented by an embedded content addressable memory circuit or other parallel-compare circuit), thereby enabling the lookup table 281 to be loaded in arbitrary order and enabling bank address sequencing in arbitrary order.

B. Controller-Independent Operation

1. Refresh Cycle Donation

Figure 12:
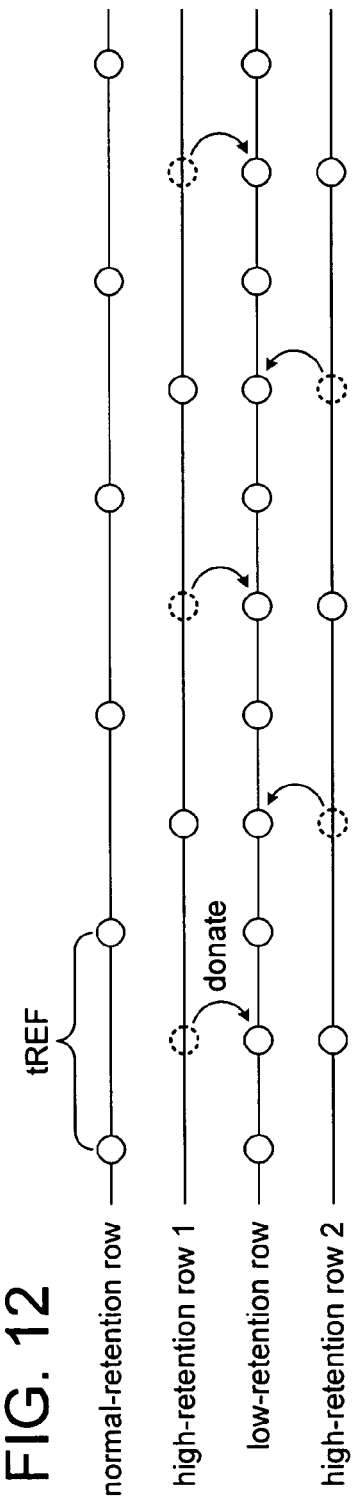
FIG. 12 illustrates a technique for achieving address-differentiated refresh rates within a memory device without increasing the number or type of refresh commands issued by a memory controller.

FIG. 12 illustrates a technique for achieving address-differentiated refresh rates within a memory device without increasing the number or type of refresh commands issued by a memory controller. In a general embodiment, each low-retention storage row is associated with two or more high-retention storage rows (i.e., storage rows identified through cell retention testing as meeting an extended cell retention time) so that the high-retention rows may donate surplus refresh cycles to the low retention row. For example, in the specific arrangement of FIG. 12, two high-retention rows each require refreshing not more than once every two tREF intervals so that, in every other refresh cycle (i.e., every other tREF interval) a refresh operation may be re-directed from the high-retention row to an associated low-retention row. That is, the refresh window allocated to a high-retention row for a given refresh cycle is donated, directly or indirectly, to the low-retention row; an operation referred to herein as refresh cycle donation. By staggering the refresh cycles in which each of the two of high retention rows donates a refresh window to the associated low-retention row, the low-retention row may be refreshed twice per tREF interval, thus achieving the desired refresh rate for the low-retention row. In embodiments where low-retention rows or any subset thereof require a refresh rate greater than 2× (i.e., K>2), additional high-retention rows may be associated with such low-retention rows as necessary to donate the requisite number of refresh windows.

Still referring FIG. 12, the refresh windows donated to a given low retention row are to have a timing offset relative to the primary refresh window for the low-retention row (i.e., the refresh window allocated to the low retention row through ordinal address sequencing in contrast to a donated refresh window). For example, if the primary refresh window occurs at window number 10 of a 1024-window refresh cycle, and the low-retention row is to have a 2× refresh rate, then the donated refresh window should be at or near refresh window number 522 (i.e., primary refresh window+number of windows/2). In an embodiment that uses ordinal address sequencing, the timing offset of the window to be donated may be determined using address arithmetic. That is, the window to be donated corresponds to a midpoint row (MPR) address (also referred to as a swap row address) that is offset from the address of the low-retention row (LRR) by N/2 (i.e., MPR address=(LRR address+N/2) mod N), where N is the number of accessible storage rows in the memory device. Assuming that the midpoint row is not a high-retention row (a statistically likely scenario in a memory device having predominantly normal-retention rows), then in order to free the refresh window of the midpoint row for re-allocation to the low-retention row, a refresh window of a first high retention row is re-allocated (i.e., remapped) to the midpoint row. To ensure that the displaced high-retention row is refreshed at least once every other refresh cycle, the refresh window of a second high-retention row is split (i.e., time multiplexed) between the first and second high-retention rows, so that the first high-retention row is refreshed instead of the second high-retention row in every other refresh cycle. Thus, working backwards through the remapping, the second high-retention row donates every other refresh window to the first high-retention row so that the first high-retention row may donate its refresh window to the midpoint row so that the midpoint row may donate its refresh window to the low-retention row. Accordingly, the first and second high-retention rows are referred to as each indirectly donating half their refresh windows to the low retention row. By contrast, if either of the high-retention rows happen to reside at the midpoint row address, the high-retention row may directly donate its refresh window to the low-retention row with no midpoint row remapping required.

Figure 13A:
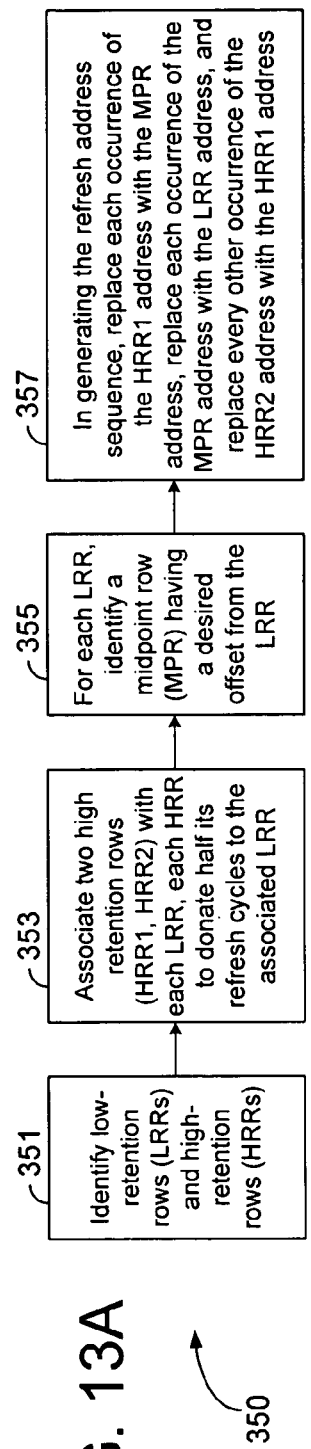
FIGS. 13A-13C illustrate an embodiment of refresh cycle donation in a memory device having at least one low-retention row that is to be refreshed twice per refresh interval and at least two high retention rows that are to be refreshed at least once every two refresh intervals.
Figure 13C:
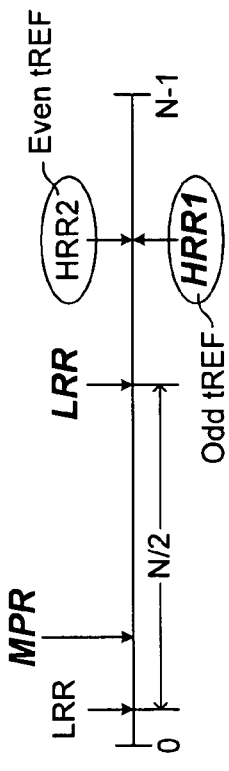
Figure 13B:
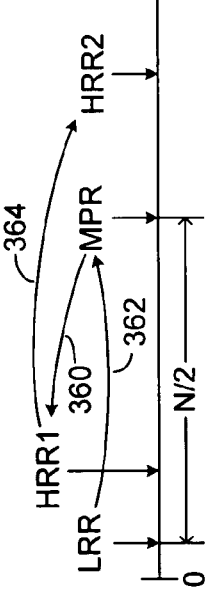

FIGS. 13A-13C illustrate an embodiment of refresh cycle donation in a memory device having at least one low-retention row to be refreshed twice per tREF interval, at least two high retention rows to be refreshed at least once every two tREF intervals, and a total of N accessible storage rows. Referring first to FIG. 13A, which outlines a refresh cycle donation scheme 350 according to one embodiment, low-retention rows and high-retention rows are identified during device testing (351), with each low-retention row (LRR) being associated with two high-retention rows, HRR1 and HRR2 (353). At 355, a midpoint row (MPR) having a refresh window at a desired window donation time (i.e., at an address having at a desired offset relative to low-retention row address) is identified for each LRR. Thereafter, when generating the refresh address sequence, each HRR1 address in an ordinal address sequence is remapped to (i.e., replaced by) the MPR address, each MPR address in the ordinal address sequence is remapped to the LRR address, and every other HRR2 address in the ordinal address sequence is remapped to the HRR1 address (357).

FIG. 13B is a diagram of the remapping operations described in block 357 of FIG. 13A. The remapping of each HRR1 address with the MPR address is indicated by 360. This operation frees the refresh window otherwise allocated to the MPR to be allocated to the LRR as indicated by arrow 362. As shown, the MPR address is offset from the LRR address by N/2, so that the MPR refresh window occurs midway between primary refresh windows of the LRR. Thus, by remapping each occurrence of the MPR address in the ordinal address sequence with the LRR address, the LRR is refreshed twice per refresh cycle at half-tREF intervals. To ensure that HRR1 is refreshed at least once every two tREF intervals, the refresh window allocated to HRR2 is reallocated to HRR1 in every other refresh cycle. That is, every other occurrence of the HRR1 address in the ordinal address sequence is remapped to the HRR2 address, as indicated by arrow 364. FIG. 13C illustrates the result of the remapping, with the identifier of each of the three storage rows that have been remapped to a different or additional position in the refresh sequence italicized.

Figure 14A:
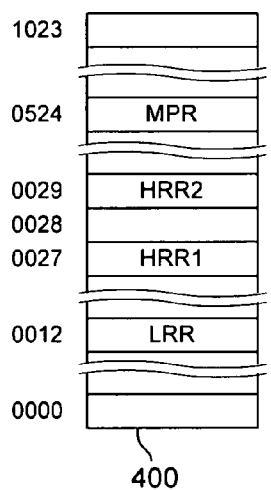
FIGS. 14A and 14B illustrate the effect of the refresh cycle donation approach described in reference to FIGS. 13A-13C within an exemplary storage array.
Figure 14B:
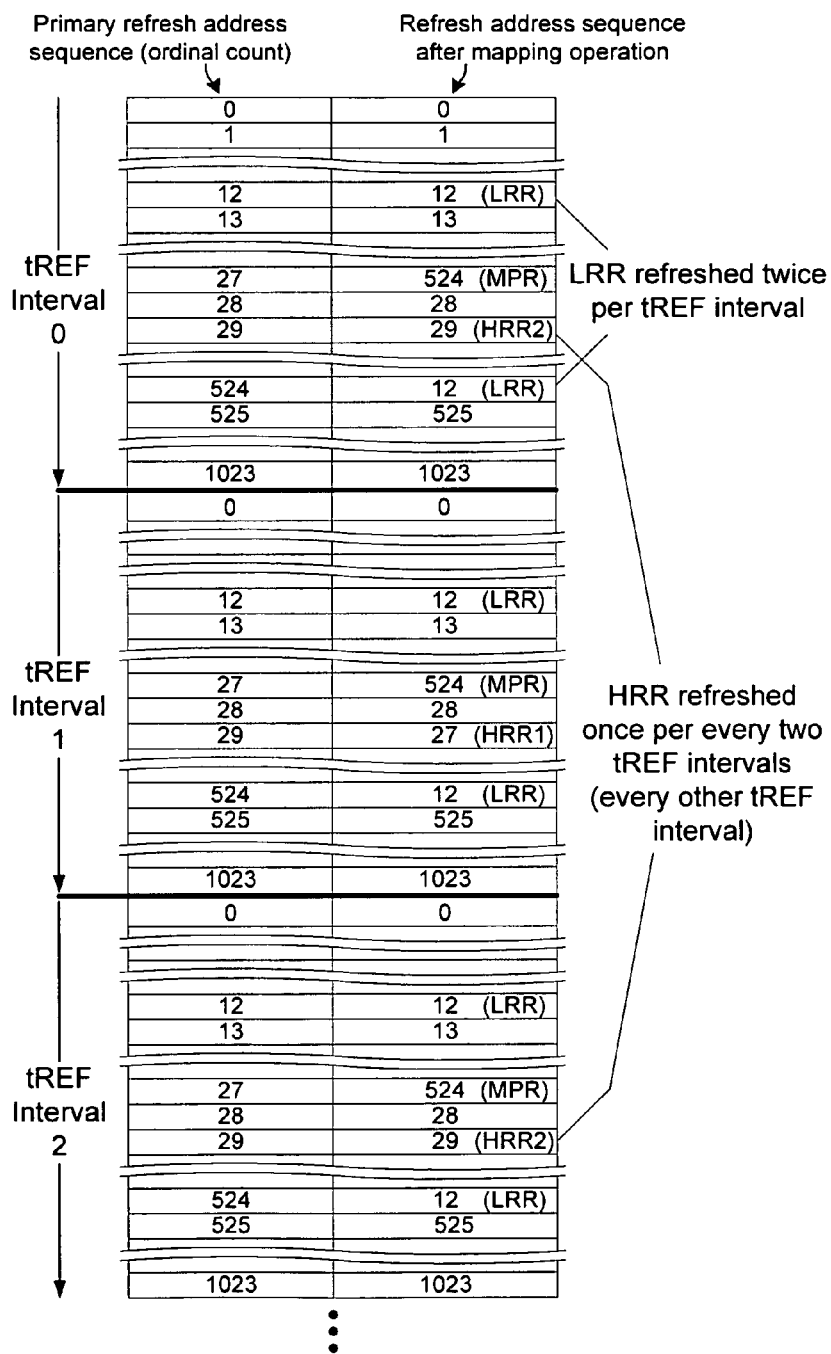

FIGS. 14A and 14B illustrate the effect of the refresh cycle donation approach described in reference to FIGS. 13A-13C within an exemplary storage array having a low-retention row that requires a 2× refresh rate and two or more high-retention rows that may be refreshed at 0.5× refresh rates. Referring first to FIG. 14A, storage array 400 has 1024 accessible storage rows (more or fewer storage rows may be provided in alternative embodiments) and has been determined to have, for example, a low-retention row (LRR) at address 12, and high-retention rows (HRR1 and HRR2) at addresses 27 and 29. Assuming an ordinal sequence of refresh addresses, the midpoint row (MPR) has address 524 (i.e., 12+(1024/2) mod 1024). Referring to FIG. 14B, which illustrates a primary refresh sequence in the left-hand column (i.e., an ordinal count sequence ranging from 0 to 1023), and a remapped refresh sequence in the right-hand column, each occurrence of the HRR1 address in the primary refresh sequence is replaced by the MPR address, thus freeing the MPR refresh window to be allocated to the LRR. Accordingly, each instance of the MPR address in the primary refresh sequence is replaced by the LRR to provide a 2× refresh rate for the LRR. Finally, to ensure that the displaced HRR1 receives at least one refresh every two refresh cycles, every other instance of the HRR2 address is replaced by the HRR1 address so that both HRR1 and HRR2 are refreshed every other tREF interval.

2. Cycle Donation Mapping

Figure 15:
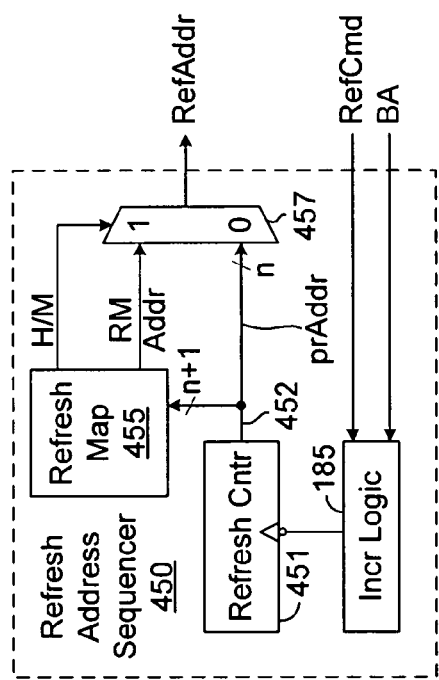
FIG. 15 illustrates an embodiment of a refresh address sequencer that may be used to effect the refresh cycle donation operation described in reference to FIGS. 12-14.

FIG. 15 illustrates an embodiment of a refresh address sequencer 450 that may be used to effect the refresh cycle donation operation described in reference to FIGS. 12-14. The refresh address sequencer 450 includes a refresh counter 451 to generate an ordinal sequence of refresh count values 452, increment logic 185 to control the incrementing of the refresh counter 451, for example, as described in reference to FIG. 3, and a refresh map circuit 455 to perform remapping operations when the refresh count 452 matches an MPR address, HRR1 address or odd-numbered HRR2 address. In one embodiment, the refresh count 452 is an (n+1)-bit value in which the lower n bits constitute an n-bit primary refresh address (prAddr), and the most significant bit (MSB) is an interval-count bit that may be used to distinguish between even and odd tREF intervals. At the start of each refresh cycle (signaled by a refresh command signal, RefCmd), the refresh map circuit 455 compares the refresh count 452 with addresses of midpoint rows and high-retention rows associated with respective low-retention rows. If a match is detected, the refresh map circuit 455 raises a hit/miss signal (H/M) and outputs a remapped address, RM Addr (i.e., a replacement address). Multiplexer 457 receives the remapped address from the refresh map circuit 455 and primary refresh address from the refresh counter 451 (i.e., the lower n-bits of the refresh count 452) at respective input ports, and the hit/miss signal at a control input. By this arrangement, when the hit/miss signal is high (indicating a match detection within the refresh map circuit 455), the remapped address supplied by the refresh map circuit 455 is output by multiplexer 457 instead of the primary refresh address. When the hit/miss signal is low, the primary refresh address is output.

Figure 16:
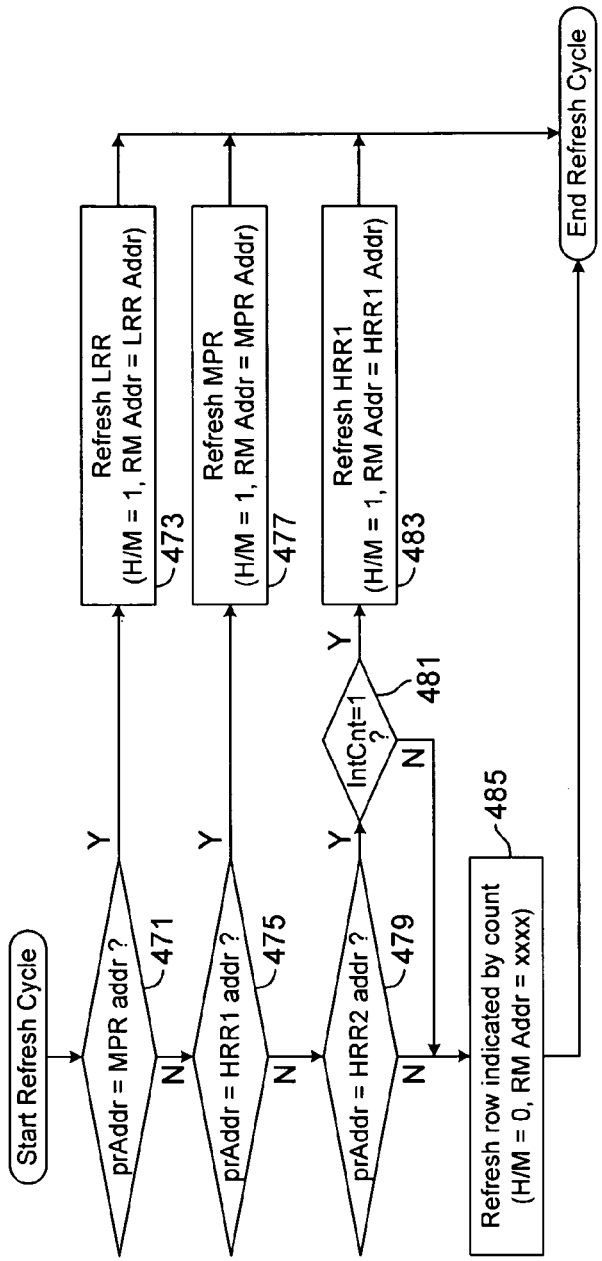
FIG. 16 illustrates the internal operation of the refresh map circuit shown in FIG. 15 according to one embodiment.

FIG. 16 illustrates the internal operation of refresh map circuit 455 of FIG. 15 according to one embodiment. At some point during a refresh operation, the primary refresh address (prAddr) from the refresh counter (i.e., lower n-bits of the row count) is compared with a midpoint row (MPR) address in decision block 471. If the primary refresh address matches the midpoint row address, the hit/miss signal is raised and the low-retention row address (LRR) that corresponds to the midpoint row address output as the remapped address, thus enabling a refresh operation at the low-retention row address as shown at 473. If the primary refresh address does not match the midpoint row address, then, at decision block 475, the primary refresh address is compared with the address of a first high-retention row (HRR1) associated with the low-retention row address. If a match is detected, the hit/miss signal is raised and the midpoint row address output to effect a refresh operation at the midpoint row as shown at 477. If the primary refresh address does not match the midpoint row address or the first high-retention row address, then the primary refresh address is compared with the second high-retention row address (HRR2) at decision block 479. If a match is detected, and if the interval-count bit (IntCnt) of the row count is determined, at decision clock 481, to be a logic '1' (i.e., indicating an odd-numbered refresh cycle), the hit/miss signal is raised and the first high-retention row address output to effect a refresh operation at the first high-retention row as shown at 483. If the row count does not match the second high-retention row, or if the interval-count bit indicates an even-numbered refresh cycle (i.e., IntCnt='0'), then the hit/miss signal is lowered in block 485 to effect a refresh operation at the row specified by the row count. Note that the remapped address from the refresh map is shown as 'xxxx' in block 485 to indicate a "don't care" state. By the above operation, HRR1 is refreshed every odd-numbered refresh cycle in block 483, and HRR2 is refreshed every even-numbered refresh cycle in block 485, and LRR is refreshed twice per refresh cycle: once in block 473 and once in block 485. Lastly, so long as the MPR and HRR1 addresses are different (the general case), the MPR is refreshed once per refresh cycle in block 477. Note that, if the MPR and HRR1 do share the same address (a special case which, as described above, simplifies the cycle donation operation as no re-mapping of an MPR is required), then block 477 will never be reached, as any primary refresh address that matches the HRR1 address will first be determined to match the MPR address in decision block 471.

Figure 17:
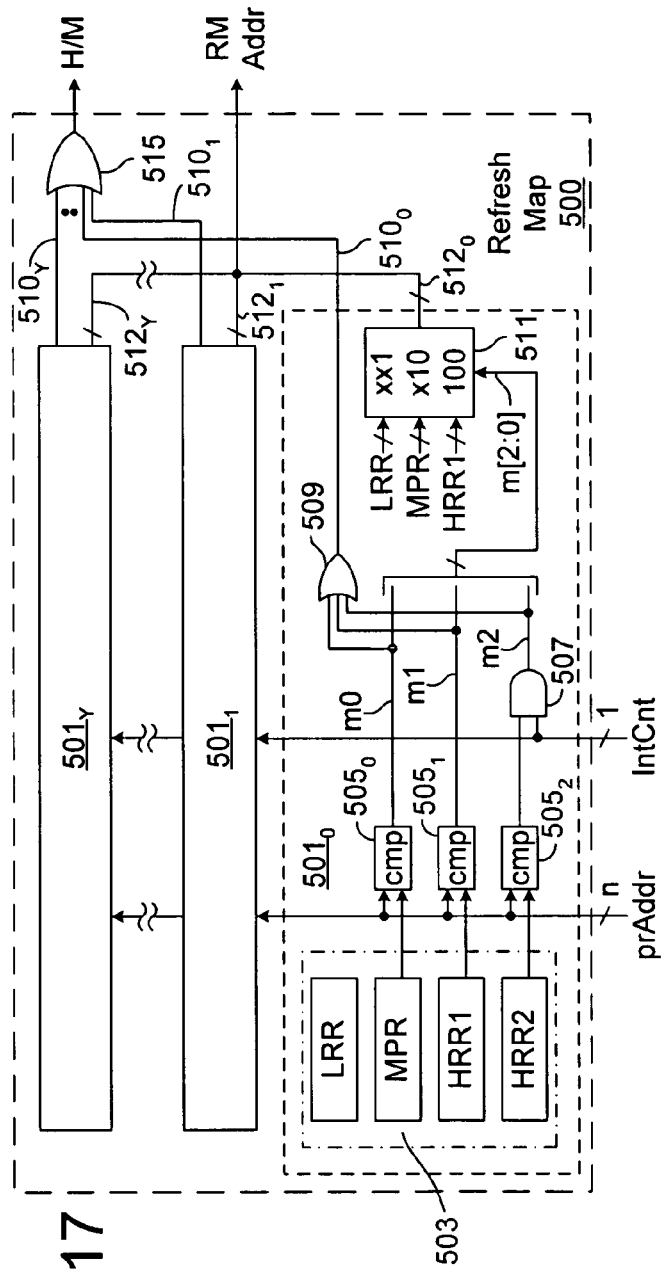
FIG. 17 illustrates an embodiment of a refresh map circuit that may be used to implement the refresh map circuit shown in FIG. 15.

FIG. 17 illustrates an embodiment of a refresh map circuit 500 that may be used to implement the refresh map circuit 455 of FIG. 15. The refresh map circuit 500 includes a set of map subcircuits $501_0$-$501_Y$ each of which generates a respective hit/miss signal $510_0$-$510_Y$ and remap address $512_0$-$512_Y$ for the midpoint row and high-retention row pair associated with a respective low-retention row address. In one embodiment, illustrated in the detail view of map subcircuit $501_0$, each map subcircuit 501 includes an address storage bank 503, comparators $505_0$-$505_2$, logic gates 507 and 509, and multiplexer 511. The address storage bank 503 includes storage for a low-retention row address (LRR), a corresponding pair of high-retention row addresses (HRR1, HRR2) and a midpoint row address (MPR), each of which may be production-time programmed (e.g., in one-time programmable elements) or loaded in a system initialization operation based on mapping information retrieved from an serial presence detect or other source. In an alternative embodiment, instead of providing storage for a midpoint row address, the midpoint row address may be synthesized (i.e., derived) from the low-retention row address, for example, by complementing the most significant bit of the low-retention row address to effect a +N/2 operation, where N is the number of accessible storage rows in the memory device.

Whether recorded or synthesized, the MPR address is provided to an input of comparator $505_0$ to be compared with the primary refresh address, prAddr (i.e., the row address component of the refresh count). The addresses of high-retention rows HRR1 and HRR2 are likewise supplied to comparators $505_1$ and $505_2$, respectively, to be compared with the primary refresh address. The outputs of comparators $505_0$ and $505_1$ constitute match signals m0 and m1, and the output of comparator $505_2$ is logically ANDed with the interval count bit, IntCnt (i.e., the MSB of the count value within the primary refresh counter), in AND gate 507 to produce an additional match signal m2. The match signals, m[2:0] are logically ORed in OR gate 509 to produce the subcircuit hit/miss signal $510_0$, and are also supplied to multiplexer 511 to select, from address storage bank 503, either the LRR address, MPR address or HRR1 address to be output as the subcircuit remap address $512_0$. More specifically, if match signal m0 is asserted (e.g., to a logic high value), the primary refresh address matches the MPR address and the LRR address is output as the remapped address $512_0$ (note that m1 and m2 are "don't cares" in this circumstance as indicated by the 'xx1' notation in multiplexer 511). If match signal m0 is deasserted and match signal m1 is asserted, then the primary refresh address matches a HRR1 address so that the MPR address is output as the remapped address $512_0$. Finally, if match signals m0 and m1 are deasserted and match signal m2 is asserted, then the primary refresh address matches the HRR2 address in an odd-numbered refresh interval so that the HRR1 address is output as the remapped address $512_0$. If none of the match signals is asserted, the subcircuit hit/miss signal $510_0$ is lowered (indicating a miss within the subcircuit) and the output of the multiplexer 511 is tri-stated to avoid contention with a remapped address 512 output by another of the subcircuits 501.

Still referring to FIG. 17, in one embodiment, the outputs of multiplexers 511 (i.e. lines $512_0$-$512_Y$) are wired together (with tri-stating used to avoid contention) to form the remapped address output, RM Addr, of the refresh map circuit 500, and the subcircuit hit/miss signals $510_0$-$510_Y$ are ORed in logic gate 515 to form the final hit/miss signal (H/M). Other logic arrangements may be used to generate the final remapped address (RM Addr) and hit/miss signal in alternative embodiments.

Figure 18:
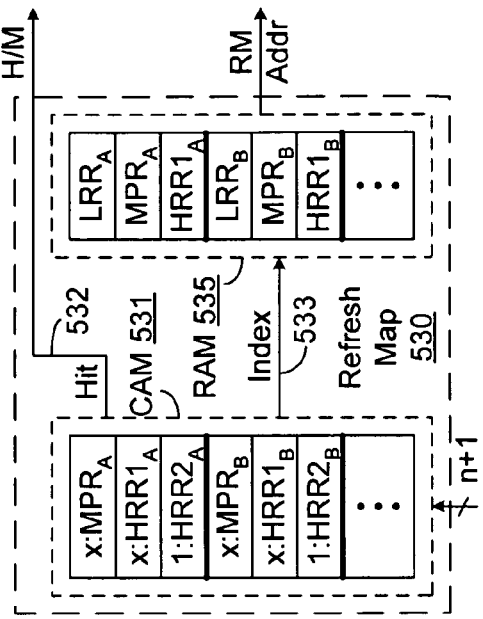
FIG. 18 illustrates an alternative embodiment of a refresh map circuit.

FIG. 18 illustrates an alternative embodiment of a refresh map circuit 530 having a content addressable memory 531 to perform a parallel compare of a refresh count (i.e., primary refresh address and interval count bit) with midpoint row addresses and high-retention row addresses associated with respective low-retention rows. In one embodiment, the content addressable memory 531 asserts a hit signal 532 if an entry matches the refresh count and outputs an index 533 that corresponds to the location of the matching entry. The index 533 is used to address an associated storage 535 which contains remapped addresses in storage locations that correspond to counterpart entries in the content addressable memory 531. Thus, if the refresh count matches a given entry in the content addressable memory 531, the hit signal 532 will be asserted (which signal may constitute the hit/miss signal (H/M) for the refresh map circuit 530), and the index 533 will select the corresponding value within the associated storage to be output as the remapped address, RM Addr.

In one embodiment, the entries within content addressable memory 531 are n+1 bits wide to enable comparison of an interval count associated with each HRR2 entries with the interval-count component of the refresh count. For comparisons in which the interval count is to be ignored (i.e., MPR and HRR1 entries), comparison of the interval count bit may be masked as indicated by the notation "x:MPR$_A$", "x:HRR1$_A$" in FIG. 18. In an alternative embodiment, two instances of each such entry may be included in the content addressable memory, one with a logic '1' interval count bit, and the other with a logic '0' interval count bit to effect a don't care as to the interval count bit state. The counterpart entries within the associated storage may be correspondingly duplicated.

Reflecting on the refresh mapping operations described in reference to FIGS. 15-18, it should be noted that each of the remapping operations may involve comparison of both row and bank components of a midpoint row address or high-retention row address with a primary refresh address. Similarly, if a match is detected, the resulting remapped low-retention row address, midpoint row address or high-retention row address may include both bank and row components. In alternative embodiments, the remapping operations may omit bank address components, for example, where rows are treated for refresh-rate purposes as spanning multiple banks.

It should also be noted that one low-retention row may be located at the midpoint row address of another low-retention row. In case of such a conflict, an available higher or lower address nearest the desired midpoint row address may be selected to be the midpoint row address for remapping purposes. This approach may be used generally to resolve address mapping conflicts.

While particular address mapping arrangements has been described, various alternative address mapping arrangements may be used. Also, in alternative embodiments, simultaneous compare circuitry such as that described in reference to FIGS. 15, 17 and 18 may be obviated by ordering entries within the refresh map according to numeric value so that the refresh map entries will match refresh count values in a deterministic order. In such an embodiment, a select counter may be provided to index the refresh map (i.e., select the refresh map entry to be compared with the refresh count at any given time), the counter being incremented in response to each match detection to advance from entry to entry.

III. Test Methodology

A. Two-Stage Cell Retention Testing

Figure 19:
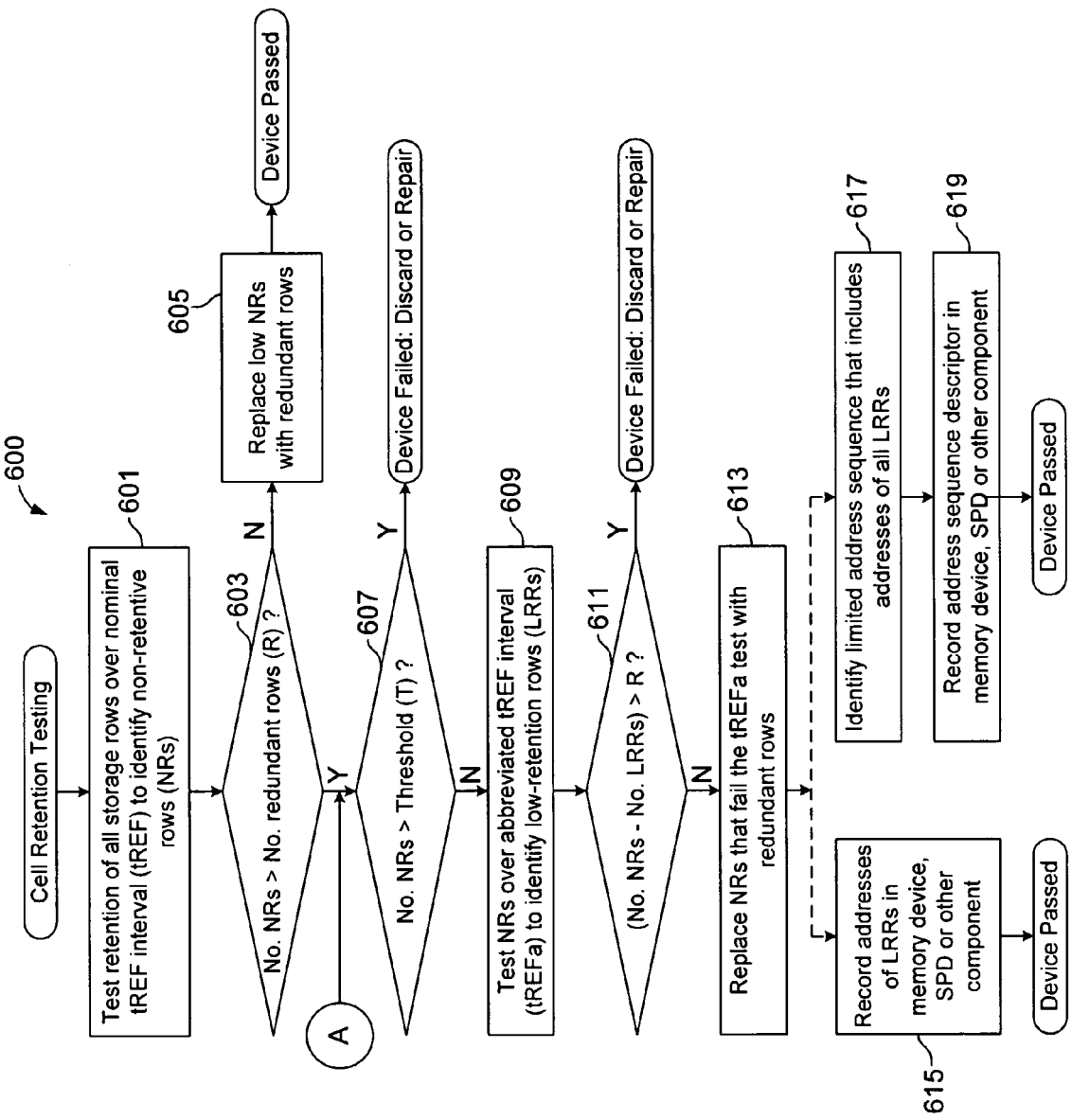
FIG. 19 illustrates an embodiment of a two-stage cell retention test that may be performed at device production time to identify low-retention storage rows.

FIG. 19 illustrates an embodiment of a two-stage cell retention test 600 that may be performed at device production time to identify low-retention storage rows. Starting at 601, a first-stage cell retention test is performed in all storage rows, with those that fail to reliably retain data for at least a nominal (target) tREF interval being identified as non-retentive rows (NRs). In one embodiment a number (R) of redundant storage rows within the memory device that are not themselves non-retentive rows may be allocated to replace non-retentive rows. Accordingly, if there are there are R or fewer non-retentive rows (i.e., number of NRs≦R as determined in decision block 603), then the non-retentive rows may be replaced with redundant rows at block 605 and the memory device designated as passing the cell retention test. If the number of non-retentive rows exceeds R, and is determined at decision block 607 to be less than a predetermined salvage threshold (T), then the device may be deemed a candidate for address-differentiated refresh. In one embodiment, the salvage threshold is determined by the expression $LRR_{MAX}$+R, where $LRR_{MAX}$ is the maximum number of low-retention rows allowed in a given class of memory device (e.g., a predetermined percentage of the total number of storage rows) and where the summation with R is to account for replacement of R non-retentive rows with redundant rows. $LRR_{MAX}$ may be any practicable number and generally expresses the tolerable additional refresh overhead that may be incurred for the device classification.

If the number of non-retentive rows exceeds the salvage threshold, the device is deemed to have failed cell retention testing and may be discarded or marked for repair. If the number of non-retentive rows does not exceed the salvage threshold, then the non-retentive rows (and potentially other storage rows) are tested in a second-stage cell retention test at 609 to identify storage rows that retain data over an abbreviated tREF interval (tREFa), such rows being designated low-retention storage rows. In one embodiment, tREFa is approximately half the nominal tREF interval, tREF so that low-retention rows are qualified as a class of non-retentive rows that will reliably retain data if refreshed at a 2× refresh rate. The tREFa interval may be longer or shorter relative to the nominal tREF interval in alternative embodiments.

In one embodiment, non-retentive rows that do not qualify as low-retention rows are deemed to be non-salvageable so that if, at decision block 611, the number of non-salvageable rows (i.e., the total number of non-retentive rows less those qualifying as low-retention rows) is determined to exceed R (the number of redundant rows allocated to replace non-retentive rows), the memory device is deemed to have failed cell retention testing and may be discarded or marked for repair. In an alternative embodiment, additional retention testing may performed at a further abbreviated cell retention time (up to a practical limit) to determine whether a higher refresh rate may be applied to salvage non-retentive rows. In either embodiment, after the second stage (or additional stages) of cell retention testing is complete, if the number of non-salvageable rows is less than R, then the non-salvageable rows (i.e., those failing the second stage retention testing) are replaced with redundant rows at 613.

In one embodiment, shown at 615, the addresses of low-retention storage rows are recorded in the memory device (e.g., in a one-time programming operation), serial presence detect or other non-volatile component associated with the memory device. Alternatively, as shown at 617, a limited, algorithmically generated address sequence that includes addresses of all low-retention rows may be identified (e.g., by a computing device that compares the low-retention row addresses with one or more algorithmically generated address sequences) and, at 619, the corresponding sequence descriptor recorded within the memory device or other programmable component associated with the memory device. In either case the device is deemed to pass cell retention testing and may be classified as an address-differentiated memory device in which selected storage rows are to be refreshed at a faster rate than others of the storage rows.

B. Three-Stage Cell Retention Testing

Figure 20:
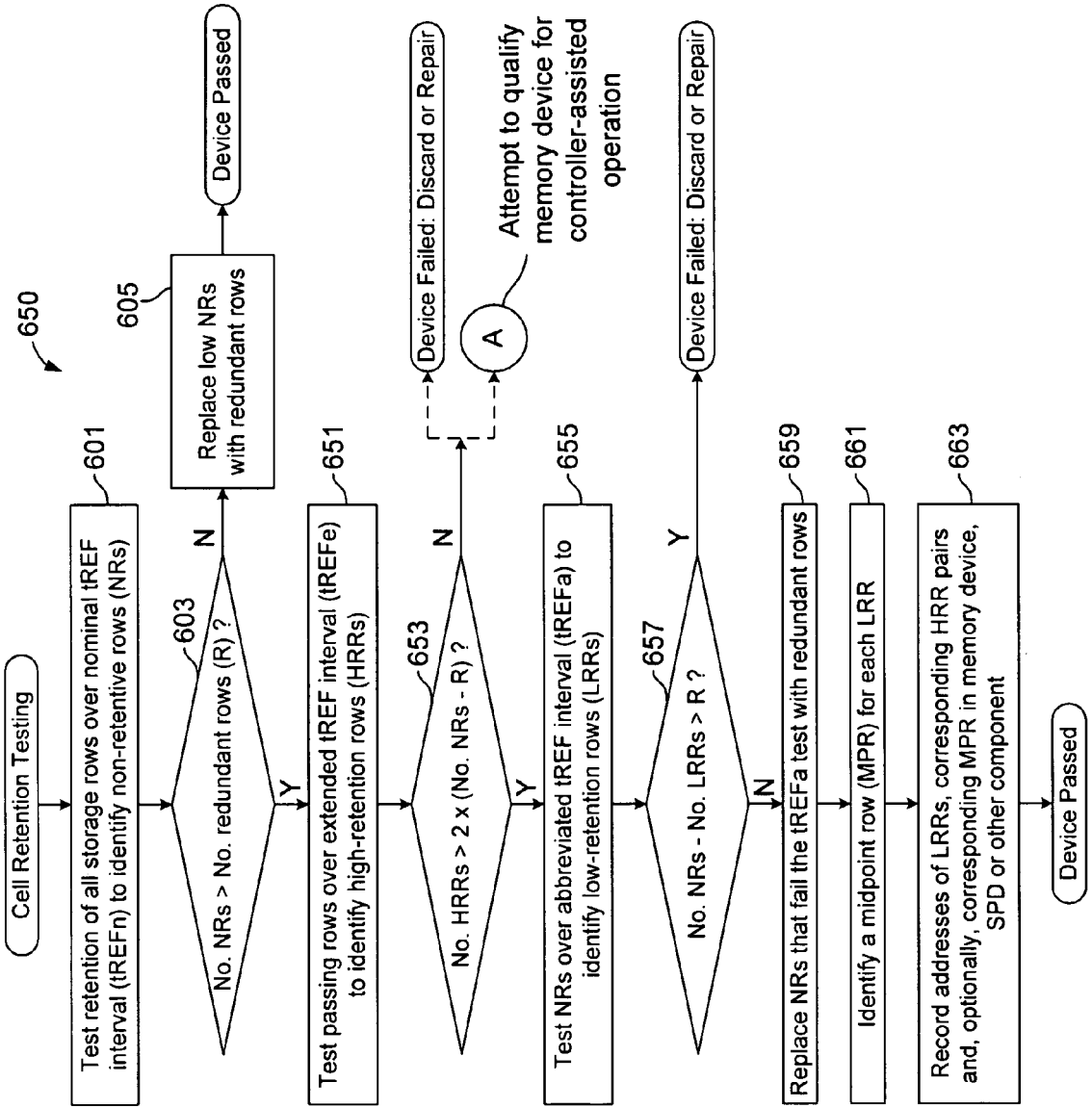
FIG. 20 illustrates a three-stage cell retention test that may be used to identify low-retention storage rows and high-retention storage rows.

FIG. 20 illustrates a three-stage cell retention test 650 that may be used to identify low-retention storage rows and high-retention storage rows, for example, to enable the refresh cycle donation operation described above. Starting at 601, a first-stage cell retention test is performed to identify non-retentive rows (i.e., storage rows that fail to reliably retain data for at least a nominal (target) tREF interval). As in the two-stage cell retention test 600, if there are R or fewer non-retentive rows (i.e., number of NRs≦R as determined in decision block 603), then the non-retentive rows may be replaced with up to R redundant rows at 605 and the memory device designated as passing cell retention testing. Otherwise, a second-stage cell retention test is performed at 651 to identify storage rows that reliably retain data over an extended tREF interval (tREFe), with such rows being classified as high-retention storage rows. In the embodiment of FIG. 20, the extended tREF interval is approximately twice as long as the nominal tREF interval so that high-retention rows are qualified as those that require refresh no more than once every other tREF interval. Also, low-retention rows are defined as that subset of non-retentive rows that reliably retain data over an abbreviated tREF interval (tREFa) that is approximately half as long as the nominal tREF interval. As described above, in such an embodiment, two high-retention rows may be assigned to donate half their refresh cycles to an associated low-retention row so that the low-retention row is refreshed at a 2× rate (i.e., once per tREFa interval) and each of the high-retention row is refreshed at a 0.5× rate (once per tREFe interval). Accordingly, as shown in decision block 653, if the number of high-retention rows is less than twice the putative number of low-retention rows (i.e., number of non-retentive rows less R), then there are insufficient high-retention rows to employ refresh cycle donation to salvage the memory device. In one embodiment, the device may be deemed to have failed cell retention testing if there are insufficient high-retention rows to employ refresh cycle donation, and the part discarded or marked for repair. Alternatively, the device may be designated for further testing, for example taking up the two-stage cell retention test 600 of FIG. 19 at the point marked by the circled 'A' to determine if the memory device qualifies for controller-assisted address-differentiated refresh operation.

Continuing with FIG. 20, if there are sufficient high-retention rows to employ refresh cycle donation, then a third-stage cell retention test is performed at 655 to identify low-retention rows. As described in reference to FIG. 19, if the number of non-salvageable non-retention rows (i.e., those not qualifying as low-retention rows) is greater than R (i.e., the number of redundant rows allocated to replace non-retentive rows), the device may be deemed to have failed cell retention testing and discarded or marked for repair.

If the number of non-salvageable rows is determined in decision block 657 to be less than R, then non-salvageable rows are replaced with redundant rows at 659. In one embodiment, a respective midpoint row is identified for each low-retention row at 661 and, at 663, addresses of the low-retention rows, corresponding midpoint row and high-retention row pairs are recorded in the memory device or associated non-volatile storage, thus concluding a successful cell retention test. In an embodiment in which the midpoint row address is derived from the corresponding low-retention row address (i.e., generated by a logic circuit instead of being explicitly recorded), the midpoint row identification at 661 and midpoint row address storage at 663 may be omitted.

IV. Computer-Readable Representations of Devices and Processes

Any or all of the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Various aspects of the subject-matter described herein are set out in the following numbered clauses:

1. A memory controller comprising:
   refresh control circuitry to generate a first refresh command directed to a first row of storage cells within a memory device at a first rate and to generate a second refresh commands directed to a second row of storage cells within the memory device at a second rate; and
   output circuitry to output the first and second refresh commands to the memory device.
2. The memory controller of clause 1 wherein the refresh control circuitry comprises command generation circuitry to generate a first number of first refresh commands during a refresh interval and to generate a second number of second refresh commands during the refresh interval.
3. The memory controller of clause 2 wherein the refresh control circuitry further comprises a first counter circuit to assert a first refresh signal the first number of times during the refresh interval and a second counter circuit to assert a second refresh signal the second number of times during the refresh interval.
4. The memory controller of clause 3 wherein the command generation circuitry is configured to generate the first refresh commands in response to assertions of the first refresh interrupt signal and to generate the second refresh commands in response to assertions of the second refresh interrupt signal.
5. The memory controller of clause 4 further comprising a programmable circuit to store a first value that controls a number of count operations required for the first counter circuit to count from a first initial count to a first terminal count and a second value that controls a number of count operations required for the second counter circuit to count from a second initial count to a second terminal count, the first and second values being determined, based at least in part, on the first number and the second number, respectively, and wherein the first counter circuit is configured to assert the normal-retention refresh signal in response to reaching the first terminal count and the second counter circuit is configured to assert the low-retention refresh signal in response to reaching the second terminal count.
6. The memory controller of clause 2 further comprising an address generating circuit to generate a sequence of addresses that are output to the memory device, one after another, in association with respective second refresh commands.
7. The memory controller of clause 6 wherein the address generating circuit comprises an address pattern generator to generate the sequence of addresses in a predetermined pattern.
8. The memory controller of clause 6 wherein the address generating circuit comprises an address storage circuit to store each address of the sequence of addresses.
9. The memory controller of clause 1 wherein the refresh control circuitry comprises an address generating circuit to generate a repeating sequence of row addresses, the sequence of row addresses including a singular instance of a first address that corresponds to the first row of storage cells and plural instances of a second address that corresponds to the second row of storage cells.
10. The memory controller of clause 9 wherein the address generating circuit comprises:
    an address counter to generate a first sequence of addresses that includes a single instance of the first addresses and a single instance of the second address; and
    an address insertion circuit to insert an additional instance of the second address between successive addresses of the first sequence in response to detecting that the first sequence of addresses has progressed to an address having a predetermined offset from the second address.
11. A method of operation within a memory controller, the method comprising:
    generating refresh commands directed to a first row of storage cells within a memory device at a first rate; and
    generating refresh commands directed to a second row within the memory device at a second rate, the second rate being faster than the first rate.
12. The method of clause 11 wherein generating refresh commands directed to the first row of storage cells comprises generating a first number of first-type refresh commands during a refresh interval and wherein generating refresh commands directed to the second row of storage cells comprises generating a second, different number of second-type refresh commands during the refresh interval.
13. The method of clause 12 wherein generating a first number of first-type refresh commands during a refresh interval comprises programming a first counter circuit to reach a terminal count value and assert a first refresh signal the first number of times during the refresh interval, and wherein generating a second number of second-type refresh commands during the refresh interval comprises programming a second counter circuit to reach a terminal count value and assert a second refresh signal the second number of times during the refresh interval.
14. The method of clause 13 wherein programming the second counter circuit comprises programming a count range within the second counter circuit in accordance with a value that indicates a number of low-retention storage rows within the memory device.
15. The method of clause 13 wherein programming the second counter circuit comprises programming a count range within the second counter circuit in accordance with a value that indicates a pattern of addresses within the memory device.
16. The method of clause 12 further comprising generating a sequence of refresh addresses that are output to the memory device, one after another, in association with respective second-type refresh commands.
17. The method of clause 16 wherein generating the sequence of refresh addresses comprises algorithmically generating the sequence of refresh addresses.
18. The method of clause 17 further comprising storing in a configuration circuit of the memory controller a value that specifies one of a plurality of algorithms for algorithmically generating the sequence of refresh addresses.
19. The method of clause 16 wherein generating the sequence of refresh addresses comprises retrieving each refresh address in the sequence of refresh addresses from an address storage table of the memory controller.

20. The method of clause 19 further comprising loading the address storage table with the refresh addresses in an initialization operation.

21. The method of clause 11 wherein generating refresh commands directed to a first row at a first rate and refresh commands directed to a second row at a second rate comprises generating a repeating sequence of row addresses, the sequence of row addresses including a singular instance of a first address that corresponds to the first row and plural instances of a second address that corresponds to the second row.

22. A memory system comprising:
 a memory device having first and second rows of storage cells; and
 a memory controller to issue refresh commands to the memory device to effect a first refresh rate for the first row of storage cells and a second refresh rate for the second row of storage cells.

23. The memory system of clause 22 further comprising a non-volatile storage circuitry to store information indicative of an address of the second row.

24. The memory system of clause 23 further comprising a memory module coupled to the memory controller and having the memory device and a non-volatile storage device mounted thereon, and wherein the non-volatile storage circuitry is disposed within the non-volatile storage device.

25. The memory system of clause 23 wherein the non-volatile storage circuitry comprises programmable elements disposed within the memory device.

26. The memory system of clause 23 wherein the memory controller is configured to retrieve the information from the non-volatile storage circuitry and store the information within a programmable address circuit to enable the programmable address circuit to provide the address of the second row in a refresh operation.

27. The memory system of clause 26 wherein the programmable address circuit is disposed within the memory controller.

28. The memory system of clause 26 wherein the programmable address circuit is disposed within the memory device.

29. The memory system of clause 23 wherein the information indicative of an address of the second row comprises the address of the second row.

30. The memory system of clause 23 wherein the information indicative of an address of the second row comprises a value that indicates a pattern of addresses that includes the address of the second row.

31. A method of operation within a memory system, the method comprising:
 issuing refresh commands to a memory device to effect a first refresh rate for a first row of storage cells within a memory device; and
 issuing refresh commands to the memory device to effect a second rate for a second row of storage cells within the memory device, the second refresh rate being faster than the first refresh rate.

32. The method of clause 31 further comprising retrieving information indicative of an address of the second row of storage cells from a non-volatile storage device.

33. The method of clause 32 further comprising storing the information within a memory controller to enable the memory controller to provide the address of the second row in association with the refresh commands issued to the memory device to effect the second refresh rate.

34. The method of clause 32 further comprising storing the information within the memory device to enable an address generating circuit within the memory device to provide the address of the second row in association in a refresh operation.

35. The method of clause 32 wherein the information indicative of an address of the second row comprises the address of the second row.

36. The method of clause 32 wherein the information indicative of an address of the second row comprises a value that indicates a pattern of addresses that includes the address of the second row.

37. The method of clause 31 wherein the first row is one of a plurality of rows that exhibit at least a first retention time, and the second row exhibits a retention time that is shorter than the first retention time, the method further comprising retrieving information indicative of a number of rows of storage cells within the memory device that exhibit a retention time that is shorter than the first retention time, and wherein issuing refresh commands to the memory device to effect the first refresh rate and issuing refresh commands to the memory device to effect the second refresh rate collectively comprise issuing, during a refresh interval of the memory device, a number of refresh commands in accordance with the information indicative of the number of rows that exhibit the retention time that is shorter than the first retention time, the number of refresh commands exceeding the number of accessible rows of storage cells within the memory device.

38. The method of clause 37 further comprising generating a sequence of refresh addresses within the memory device in response to the number of refresh commands, the sequence of refresh addresses including singular instances of addresses that correspond to the rows that exhibit at least the first retention time and plural instances of an address that corresponds to the second row.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. A memory controller comprising:
 a first integrated circuit chip including
 refresh control circuitry configured to generate a first-type refresh command at a first refresh rate by a first refresh address generator, and directed to a first row of storage cells within an external memory device at the first refresh rate and configured to generate a second-type refresh command at a second refresh rate by a second refresh address generator, and directed to a second row of storage cells within the external memory device at the second refresh rate,
 wherein the second-type refresh command comprises an accelerated refresh rate which is higher than the first refresh rate; and wherein the first row is one of a plurality of rows that exhibit at least a first retention time, and the second row of storage cells within the memory device exhibits a retention time that is shorter than the first retention time, wherein the refresh control circuitry further comprises an address generating circuit configured to generate a series of repeating sequences of row addresses, each sequence of row addresses including a singular instance of a first address that corresponds to the first row of storage cells and plural instances of a second address that corresponds to the second row of storage cells, wherein, within a single sequence of the series of repeating sequences of row addresses, the singular instance of the first address may be located either before or after the location of any of the plural instances of the second address; and output circuitry configured to output the first and second refresh command types to the external memory device according to the generated series of repeating sequences of row addresses, the external memory device comprising a second integrated circuit chip.

2. The memory controller of claim 1 wherein the address generating circuit comprises:

an address counter to generate a first sequence of addresses that includes a single instance of the first addresses and a single instance of the second address; and an address insertion circuit to insert an additional instance of the second address between successive addresses of the first sequence in response to detecting that the first sequence of addresses has progressed to an address having a predetermined offset from the second address.

3. The memory controller of claim 1 wherein the first-type refresh command and the second-type refresh command are different commands and contain respective refresh rate indicia that, when received by the external memory device, cause the application of different internal refresh commands in the memory device.

4. The memory controller of claim 1 and further including circuitry to transfer data between the external memory device and a host in connection with a memory access operation.

5. A method of operation within a memory controller, the memory controller comprising a first integrated circuit chip, the method comprising:

generating a first number of first-type refresh commands at a first refresh rate by a first refresh address generator, and directed to a first row of storage cells within an external memory device at the first refresh rate, the external memory device comprising a second integrated circuit chip;

generating a second, different number of second-type refresh commands at a second refresh rate by a second refresh address generator, and directed to a second row within the external memory device at the second refresh rate, the second refresh rate being faster than the first refresh rate;

wherein the first row is one of a plurality of rows that exhibit at least a first retention time, and the second row of storage cells within the memory device exhibits a retention time that is shorter than the first retention time;

algorithmically generating a series of repeating sequences of refresh addresses, in association with respective first-type refresh commands and second-type refresh commands, wherein, within a single sequence of refresh addresses, the addresses associated with the first-type refresh commands may be located either before or after the location of any of the addresses associated with the second-type refresh commands;

outputting the first and second refresh command types to the external memory device according to the generated series of repeating sequences of refresh addresses.

6. The method of claim 5 further comprising storing in a configuration circuit of the memory controller a value that specifies one of a plurality of algorithms for algorithmically generating the sequence of refresh addresses.

7. The method of claim 5 wherein generating the series of repeating sequences of refresh addresses comprises retrieving each refresh address in each sequence of refresh addresses from an address storage table of the memory controller.

8. The method of claim 7 further comprising loading the address storage table with the refresh addresses in an initialization operation.

9. A method of operation within a memory controller, the memory controller comprising a first integrated circuit chip, the method comprising:

generating first-type refresh commands at a first refresh rate by a first refresh address generator, directed to a first row of storage cells within an external memory device at the first rate, the external memory device comprising a second integrated circuit chip;

generating second-type refresh commands at a second refresh rate by a second fresh address generator, directed to a second row within the external memory device at the second rate, the second rate being faster than the first rate;

wherein the first row is one of a plurality of rows that exhibit at least a first retention time, and the second row of storage cells within the memory device exhibits a retention time that is shorter than the first retention time;

generating a series of repeating sequences of row addresses, each sequence of row addresses including a singular instance of a first address that corresponds to the first row and plural instances of a second address that corresponds to the second row, wherein, within a single sequence of row addresses, the singular instance of the first address may be located either before or after the location of any of the plural instances of the second address; and outputting the first and second refresh command types to the external memory device according to the generated series of repeating sequences of row addresses.

10. The method of claim 9 wherein generating refresh commands directed to a first row comprises generating commands of a first-type and wherein generating refresh commands directed to a second row comprises generating commands of a second-type, the first-type and second-type commands being different and including indicia that, when received by the external memory device, cause the application of different internal refresh commands in the memory device.

11. The method of claim 9 and further including transferring data between the external memory device and a host in connection with a memory access operation.

12. A memory system comprising:

a first integrated circuit chip including a memory device having first and second rows of storage cells;

a second integrated circuit chip including a memory controller external to the memory device configured to issue first-type refresh commands at a first refresh rate by a first refresh address generator, to the memory device to effect the first refresh rate for the first row of storage cells and second-type refresh commands at a second, faster refresh rate, by a second refresh address generator for the second row of storage cells;

wherein the first row is one of a plurality of rows that exhibit at least a first retention time, and the second row of storage cells within the memory device exhibits a retention time that is shorter than the first retention time;

circuitry configured to generate a series of repeating sequences of row addresses, each sequence of row addresses including a singular instance of a first address that corresponds to the first row and plural instances of a second address that corresponds to the second row, wherein, within a single sequence of row addresses, the singular instance of the first address may be located either before or after the location of any of the plural instances of the second address;

non-volatile storage circuitry configured to store information indicative of an address of the second row, wherein the information indicative of an address of the second row comprises a value that indicates a pattern of addresses that includes the address of the second row; and output circuitry configured to output the first and second refresh command types to the external memory device according to the generated series of repeating sequences of row addresses.

13. A method of operation within a memory system, the method comprising:

issuing first-type refresh commands at a first refresh rate by a first refresh address generator, from a first integrated circuit chip including a memory controller to a second integrated circuit chip including a memory device to effect the first refresh rate for a first row of storage cells within the memory device, the memory device disposed external to the memory controller;

retrieving information indicative of an address of a second row of storage cells from a non-volatile storage device, wherein the information indicative of an address of a second row of storage cells within the memory device comprises a value that indicates a pattern of addresses that includes the address of the second row;

issuing second-type refresh commands at a second refresh rate by a second refresh address generator to the memory device to effect the second refresh rate for the second row, the second refresh rate being faster than the first refresh rate;

wherein the first row is one of a plurality of rows that exhibit at least a first retention time, and the second row of storage cells within the memory device exhibits a retention time that is shorter than the first retention time;

generating a series of repeating sequences of row addresses, each sequence of row addresses including a singular instance of a first address that corresponds to the first row and plural instances of a second address that corresponds to the second row, wherein, within a single sequence of row addresses, the singular instance of the first address may be located either before or after the location of any of the plural instances of the second address; and outputting the first and second refresh command types to the external memory device according to the generated series of repeating sequences of row addresses.

14. The method of claim 13 wherein issuing refresh commands comprises issuing refresh commands of a first-type and a second-type from the memory controller and having respective indicia that, when received by the external memory device, cause the application of different internal refresh commands in the memory device.

15. The method of claim 13 and further including transferring data between the external memory device and a host in connection with a memory access operation.

16. A method of operation within a memory system, the method comprising:

issuing first-type refresh commands at a first refresh rate by a first refresh address gene, from a first integrated circuit chip including a memory controller to a second integrated circuit chip including a memory device to effect the first refresh rate for a first row of storage cells within the memory device, the memory device disposed external to the memory controller, wherein the first row is one of a plurality of rows that exhibit at least a first retention time, and a second row of storage cells within the memory device exhibits a retention time that is shorter than the first retention time, the method further comprising retrieving information indicative of a number of rows of storage cells within the memory device that exhibit a retention time that is shorter than the first retention time, and wherein issuing refresh commands to the memory device to effect the first refresh rate and issuing second-type refresh commands at a second refresh rate by a second refresh address generator, to the memory device to effect the second refresh rate collectively comprise issuing, during a refresh interval of the memory device, a number of refresh commands in accordance with the information indicative of the number of rows that exhibit the retention time that is shorter than the first retention time, the number of refresh commands exceeding the number of accessible rows of storage cells within the memory device;

generating a series of repeating sequences of refresh addresses within the memory device in response to the number of refresh commands, each sequence of refresh addresses including singular instances of addresses that correspond to the rows that exhibit at least the first retention time and plural instances of an address that corresponds to the second row, wherein, within a single sequence of refresh addresses, the addresses that correspond to the rows that exhibit at least the first retention time may be located either before or after the location of any of the plural instances of an address that corresponds to the second row; and issuing the first and second refresh commands types to the memory device according to the generated series of repeating sequences of refresh addresses, to effect the second refresh rate for the second row of storage cells within the memory device, the second refresh rate being faster than the first refresh rate.

17. The method of claim 16 wherein issuing refresh commands to effect a first refresh rate comprises issuing commands of a first-type from the memory controller, and issuing refresh commands to effect a second refresh rate comprises issuing commands of a second-type from the memory controller, wherein the first-type and second-type commands are different and contain respective refresh rate indicia that, when received by the external memory device, cause the application of different internal refresh commands in the memory device.

18. The method of claim 16 wherein the memory controller includes circuitry to transfer data between the external memory device and a host in connection with a memory access operation.

19. A memory controller comprising:

a first integrated circuit chip including refresh control circuitry configured to generate a plurality of first-type refresh commands at a first refresh rate by a first refresh address generator, and directed to a plurality of normal retention rows of storage cells within a second integrated circuit chip including an external memory device at the first refresh rate and to generate a second-type refresh command at a second refresh rate by a second address generator, and directed to a low retention row of storage cells within the external memory device at the second refresh rate, the second refresh rate being faster than the first refresh rate, wherein the low retention row exhibits a shorter retention time than the normal retention rows;

wherein the refresh control circuitry further comprises an address generating circuit configured to generate a series of repeating sequences of row addresses, each sequence of row addresses including singular instances of first addresses that correspond to the normal retention rows of storage cells and plural instances of a second address that corresponds to the low retention row of storage cells, and wherein, within a single sequence of refresh addresses, the singular instances of first addresses may be located either before or after the location of any of the plural instances of the second address; and output circuitry configured to output the first and second refresh commands according to the generated series of repeating sequences of row addresses to the memory device.

20. The memory controller of claim 19 wherein the first refresh commands associated with a first refresh rate are different from the second refresh command associated with a second refresh rate, and wherein the first and second refresh commands, when received by the external memory device, cause application of different internal refresh commands in the memory device.

21. The memory controller of claim 19 and further including circuitry to transfer data between the external memory device and a host in connection with a memory access operation.

22. An integrated circuit memory chip configured to receive refresh commands of first-type, at a first refresh rate by a first refresh address generator, and refresh commands of a second type from a memory controller integrated circuit chip disposed on an external signaling path, wherein the refresh commands of first and second types are each signaled by respective particular combinations of command codes, the integrated circuit memory chip comprising:

first refresh circuitry configured to output first refresh addresses, directed to normal retention rows of storage cells within the memory chip, in response to refresh commands of the first type;

second refresh circuitry configured to output second refresh addresses, directed to low retention rows of storage cells within the memory chip, in response to refresh commands of the second type;

wherein the second-type refresh command comprises an accelerated refresh rate which is higher than the first refresh rate; and wherein the low retention rows exhibit a shorter retention time than the normal retention rows;

address sequencing circuitry configured to generate a series of repeating sequences of row addresses, each sequence of row addresses including singular instances of the first refresh addresses and plural instances of the second refresh addresses, wherein, within a single sequence of row addresses, the singular instances of the first refresh addresses may be located either before or after the location of any of the plural instances of the second refresh addresses; and output circuitry configured to output the first and second refresh command types to the external memory device according to the generated series of repeating sequences of row addresses.

23. A memory system comprising:

a memory module having a plurality of DRAM integrated circuit chips disposed thereon;

a memory controller comprising a controller integrated circuit chip external to the memory module configured to generate a plurality of first-type refresh commands at a first refresh rate by a first refresh address generator, and directed to a plurality of normal retention rows of storage cells within one of the plurality of DRAM integrated circuit chips at the first rate and configured to generate a second-type refresh command at a second refresh rate by a second refresh address generator, directed to a low retention row of storage cells within one of the plurality of DRAM integrated circuit chips at the second refresh rate, the second refresh rate being faster than the first refresh rate;

wherein the low retention row exhibits a shorter retention time than the normal retention rows;

the memory controller further comprising address generating circuitry configured to generate a series of repeating sequences of row addresses, each sequence of row addresses including singular instances of first addresses that correspond to the normal retention rows of storage cells and plural instances of a second address that corresponds to the low retention row of storage cells, wherein, within a single sequence of refresh addresses, the singular instances of first addresses may be located either before or after the location of any of the plural instances of the second address; and output circuitry configured to output the first and second refresh commands according to the generated series of repeating sequences of row addresses to the plurality of DRAM integrated circuit chips.

* * * * *